(12) United States Patent
Yang et al.

(10) Patent No.: US 11,851,321 B2
(45) Date of Patent: Dec. 26, 2023

(54) MICRO-ELECTRO MECHANICAL SYSTEM AND MANUFACTURING METHOD THEREOF

(71) Applicant: TAIWAN SEMICONDUCTOR MANUFACTURING CO., LTD., Hsinchu (TW)

(72) Inventors: Ting-Li Yang, Tainan (TW); Kai-Di Wu, Tainan (TW); Ming-Da Cheng, Taoyuan (TW); Wen-Hsiung Lu, Tainan (TW); Cheng Jen Lin, Kaohsiung (TW); Chin Wei Kang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 152 days.

(21) Appl. No.: 17/188,933

(22) Filed: Mar. 1, 2021

(65) Prior Publication Data

US 2022/0274827 A1 Sep. 1, 2022

(51) Int. Cl.
*B81B 3/00* (2006.01)
*B81C 1/00* (2006.01)

(52) U.S. Cl.
CPC .......... *B81B 3/0081* (2013.01); *B81C 1/0069* (2013.01); *B81B 2203/019* (2013.01);
(Continued)

(58) Field of Classification Search
CPC .......... B81B 3/0081; B81B 2203/0127; B81B 2203/019; B81B 2203/0353; B81B 2207/015; B81B 7/02; B81B 2201/01; B81B 2201/0235; B81B 2201/0242; B81B 2201/0257; B81B 2201/0264; B81B 2201/0271; B81C 1/0069; B81C 2201/013; B81C 2201/0181; B81C 2203/032; B81C 2203/0735; B81C 1/00023; B81C 3/001; B81C 2203/03
See application file for complete search history.

(56) References Cited

U.S. PATENT DOCUMENTS 5,646,067 A * 7/1997 Gaul ................... H01L 25/0657
438/458
10,354,980 B1 7/2019 Mushiga et al.
(Continued)

FOREIGN PATENT DOCUMENTS

JP 2004-55166 A 2/2004
JP 2016-63077 A 4/2016
(Continued)

*Primary Examiner* — Steven B Gauthier
*Assistant Examiner* — Sun Mi Kim King
(74) *Attorney, Agent, or Firm* — Studebaker & Brackett PC

(57) ABSTRACT

A micro electro mechanical system (MEMS) includes a circuit substrate comprising electronic circuitry, a support substrate having a recess, a bonding layer disposed between the circuit substrate and the support substrate, through holes passing through the circuit substrate to the recess, a first conductive layer disposed on a front side of the circuit substrate, and a second conductive layer disposed on an inner wall of the recess. The first conductive layer extends into the through holes and the second conductive layer extends into the through holes and coupled to the first conductive layer.

20 Claims, 22 Drawing Sheets

(52) U.S. Cl.
CPC .............. *B81B 2203/0127* (2013.01); *B81B 2203/0353* (2013.01); *B81B 2207/015* (2013.01); *B81C 2201/013* (2013.01); *B81C 2201/0181* (2013.01); *B81C 2203/032* (2013.01); *B81C 2203/0735* (2013.01)

(56) References Cited

U.S. PATENT DOCUMENTS

| | | |
|---|---|---|
| 2004/0061064 A1 | 4/2004 | Ono et al. |
| 2004/0212085 A1 | 10/2004 | Nomura et al. |
| 2010/0127346 A1 | 5/2010 | DeNatale et al. |
| 2013/0168740 A1 | 7/2013 | Chen |
| 2013/0286607 A1* | 10/2013 | Teraoka .................. H05K 3/46 361/752 |
| 2015/0028438 A1 | 1/2015 | Kanamaru et al. |
| 2015/0083469 A1* | 3/2015 | Sunohara ............. H01L 23/147 174/255 |
| 2016/0297674 A1 | 10/2016 | Man et al. |

FOREIGN PATENT DOCUMENTS

| | | |
|---|---|---|
| TW | 201344818 A | 11/2013 |
| TW | 201733056 A | 9/2017 |
| WO | 2013/145287 A1 | 10/2013 |
| WO | 2015/164266 A1 | 10/2015 |

\* cited by examiner

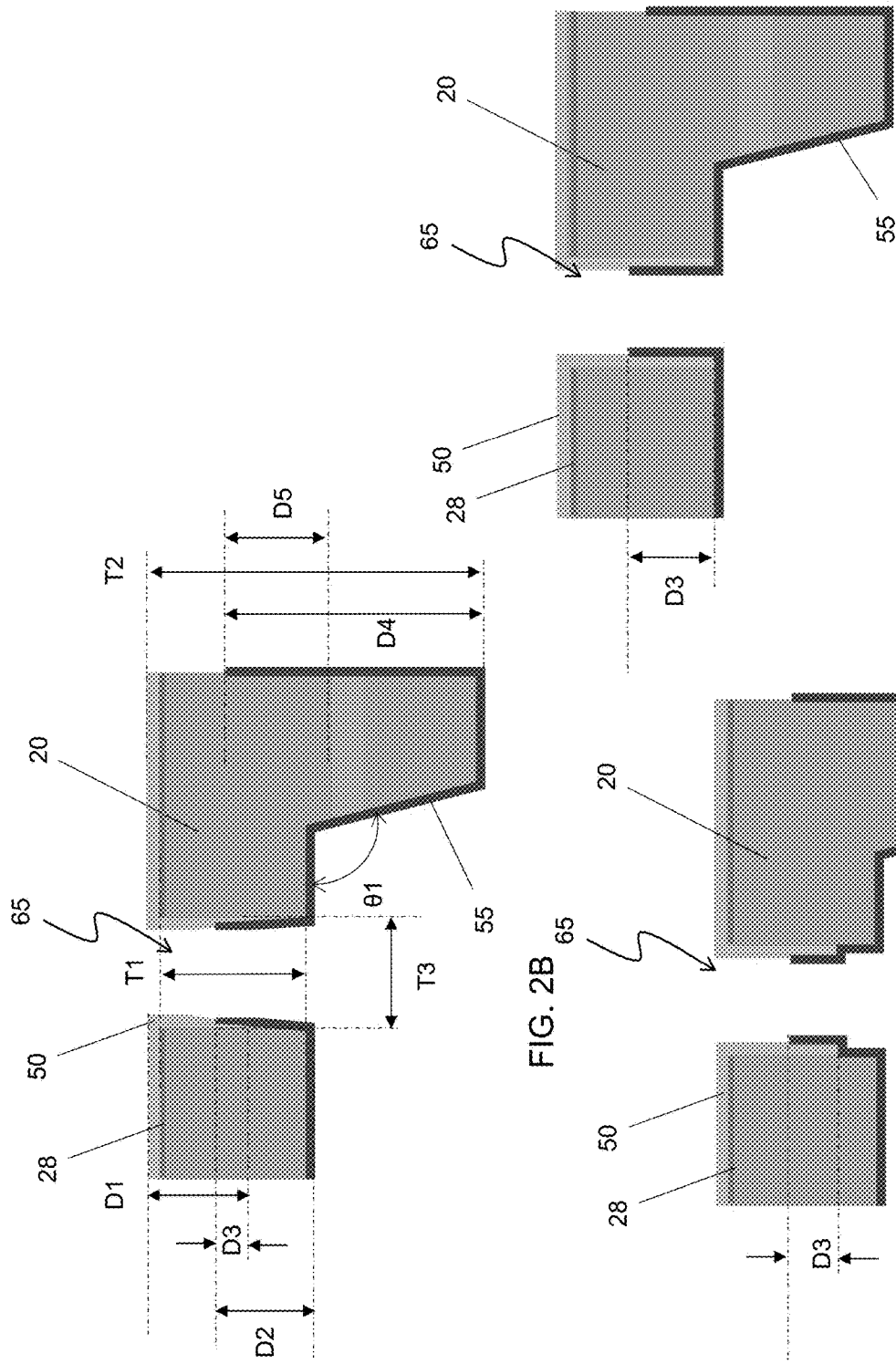

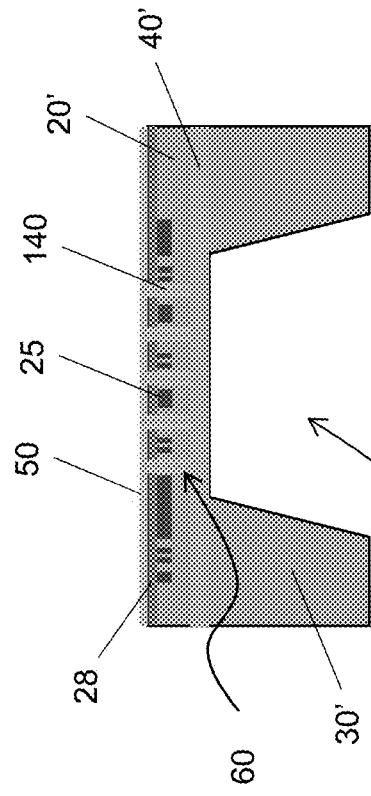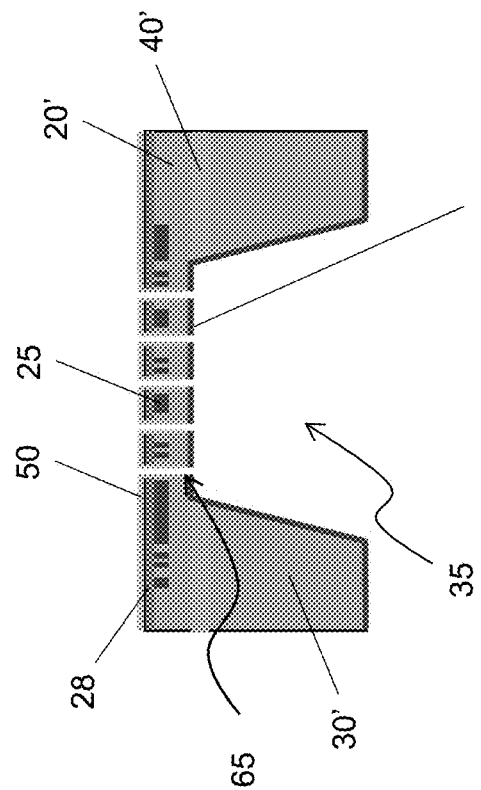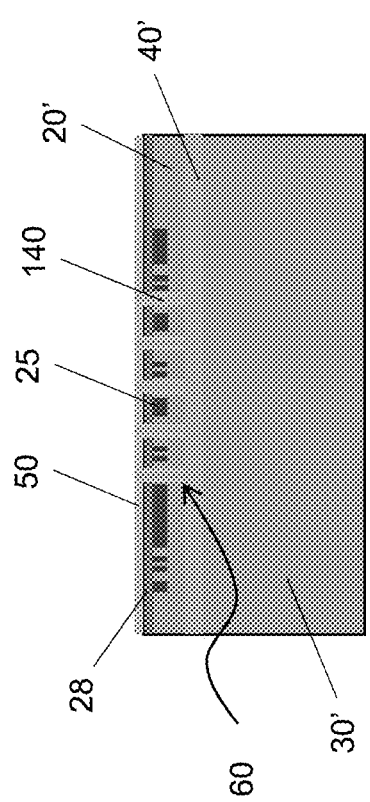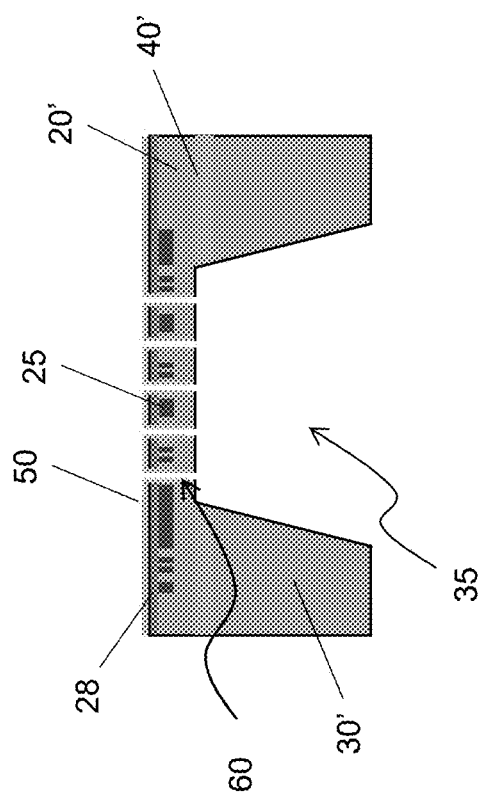
FIG. 3A
FIG. 3B
FIG. 3C
FIG. 3D

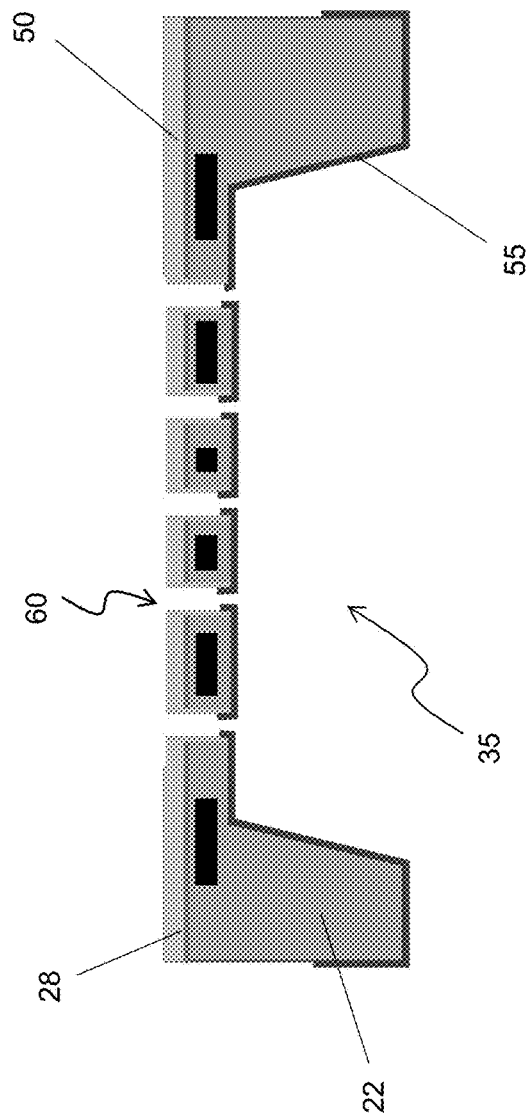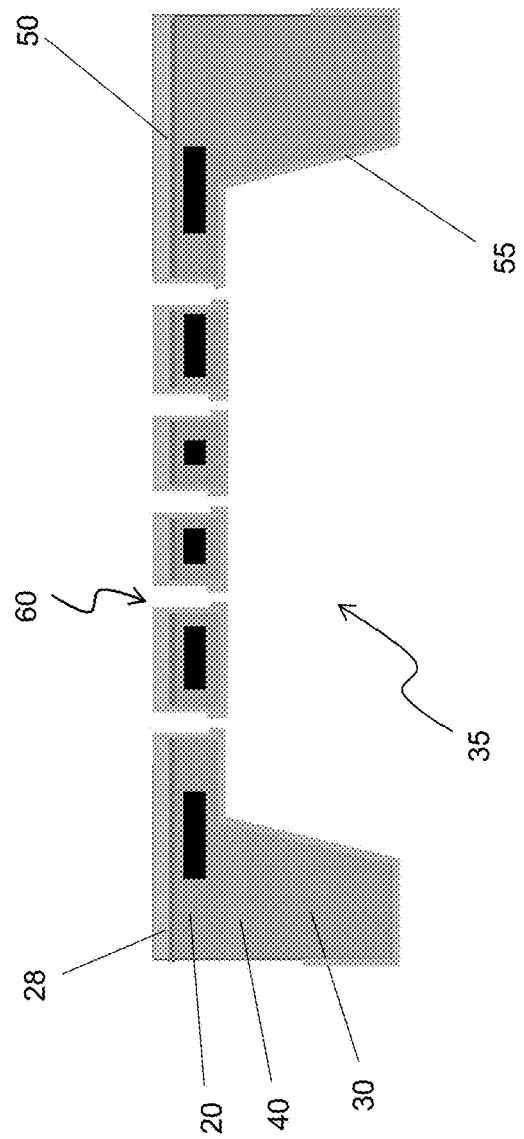

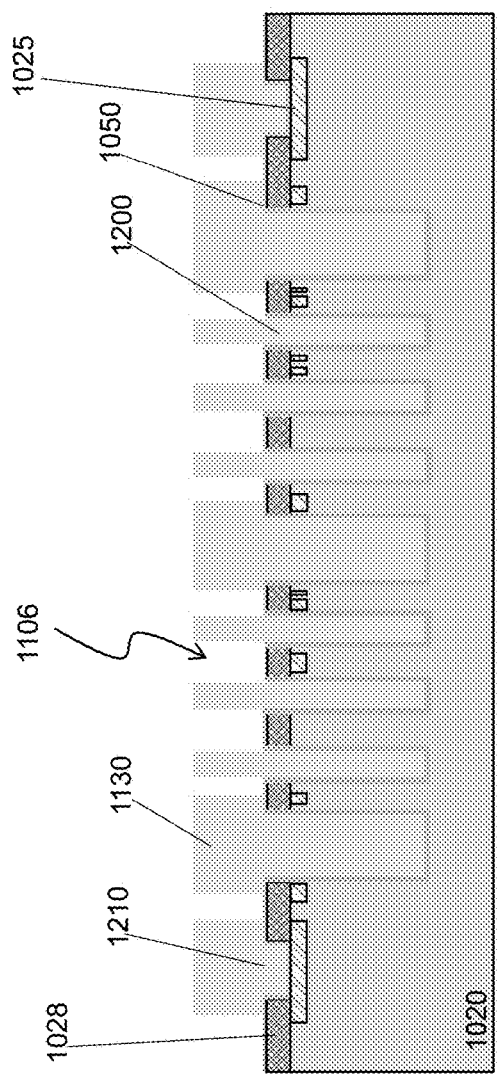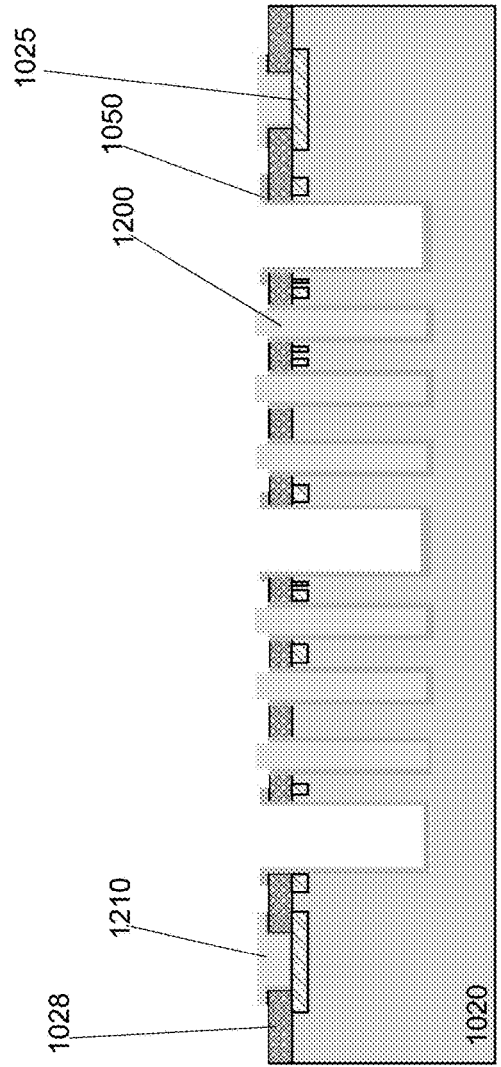

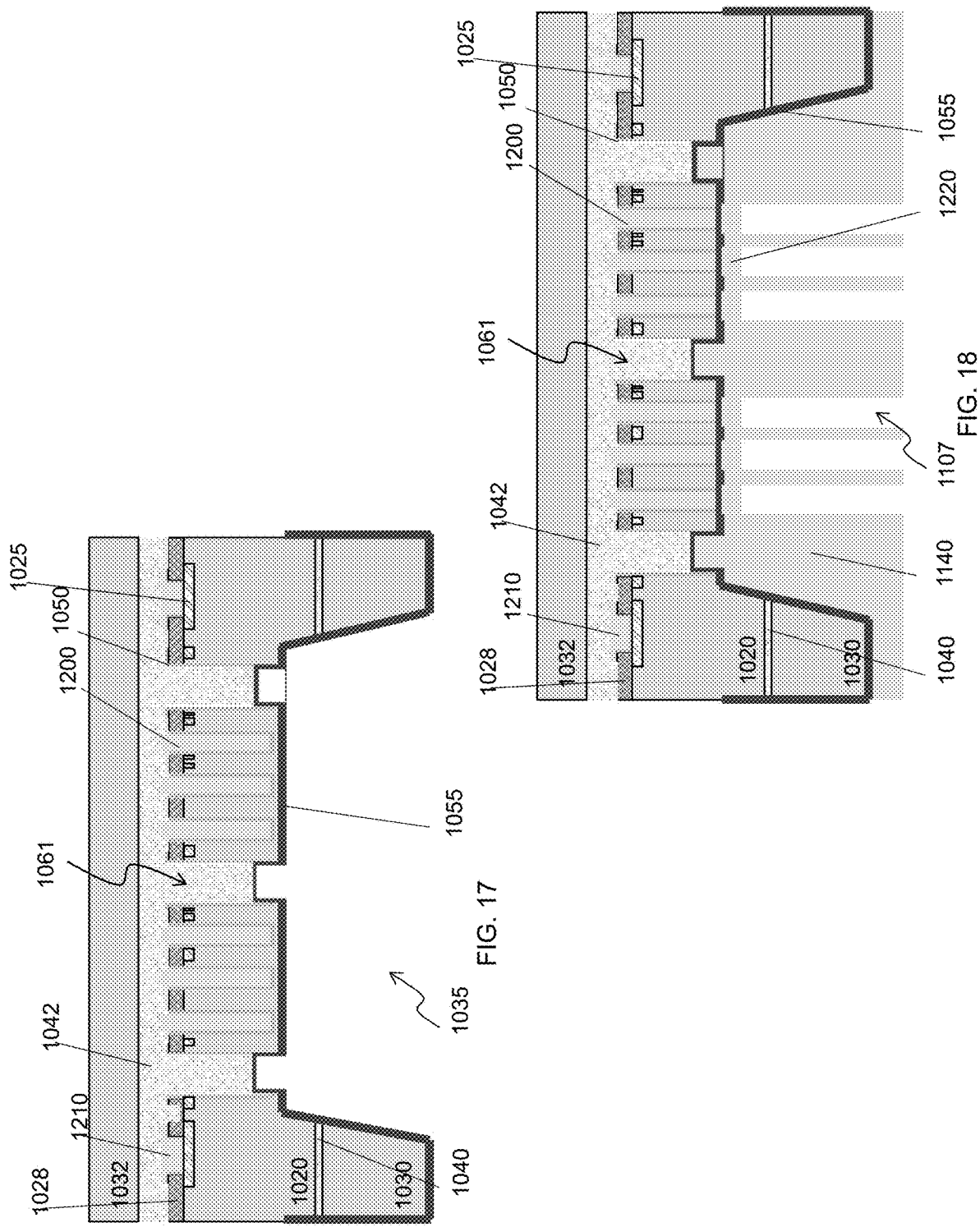

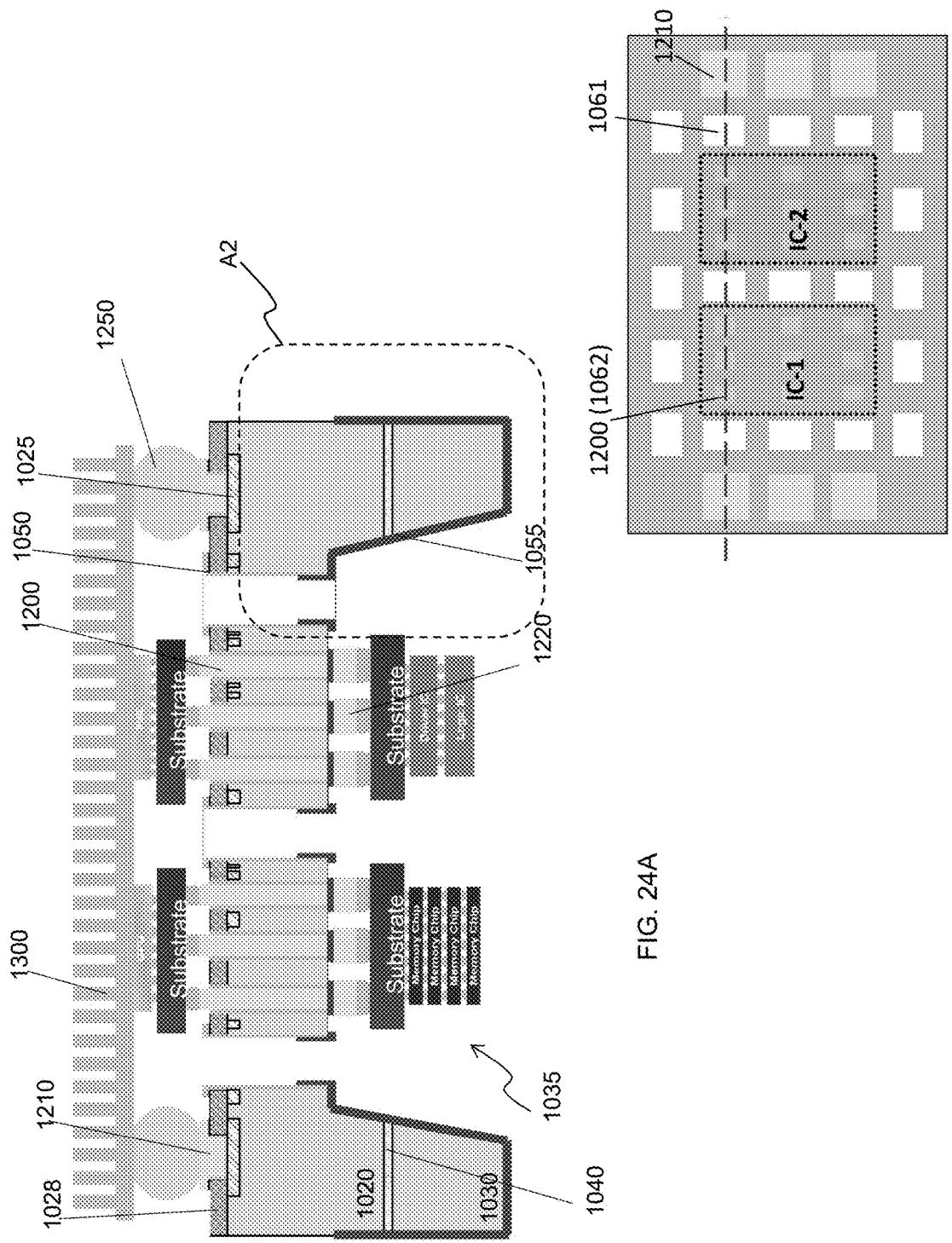

US 11,851,321 B2

MICRO-ELECTRO MECHANICAL SYSTEM AND MANUFACTURING METHOD THEREOF

BACKGROUND

Micro-electro mechanical system (MEMS) devices have recently been developed. MEMS devices include devices fabricated using semiconductor technology to form mechanical and electrical features. The MEMS devices are implemented in pressure sensors, microphones, actuators, mirrors, heaters, and/or printer nozzles. Although existing devices and methods for forming the MEMS devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A, 2B, 2C and 2D show schematic cross sectional views of MEMS devices according to embodiments of the present disclosure.

FIGS. 3A, 3B, 3C and 3D show schematic cross sectional views of the various stages of a sequential manufacturing operation for a MEMS device according to an embodiment of the present disclosure.

FIGS. 4A and 4B show schematic cross sectional views of MEMS devices according to embodiments of the present disclosure.

FIGS. 5, 6, 7, 8, 9, 10, 11, 12, 13, 14, 15, 16, 17, 18, 19, 20, 21, 22, 23 and 24A show schematic cross sectional views and FIG. 24B shows a plan view of the various stages of a sequential manufacturing operation for a MEMS device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" In the present disclosure, at least one of A, B and C means "A," "B," "C," "A and B," "A and C," "B and C," or "A, B and C," and does not mean that one from A, one from B and one from C, unless otherwise indicated. Materials, configurations, dimensions and processes described with respect to one embodiment can be applied to the other embodiments, and detailed description thereof may be omitted.

The MEMS device according to the present disclosure can be any one of a semiconductor device, an accelerometer, a gyroscope, a pressure sensor, a microphone, an RF resonator, an RF switch, or an ultra-sonic transducer.

FIGS. 1A, 1B, 1C, 1D, 1E, 1F, 1G, 1H, 1I and 1J show schematic cross sectional views of the various stages of a manufacturing operation for a MEMS device according to an embodiment of the present disclosure. It is understood that additional operations can be provided before, during, and after processes shown by FIGS. 1A-1J, and some of the operations described below can be replaced or eliminated for additional embodiments of the method. The order of the operations/processes may be interchangeable.

Figure 1B:
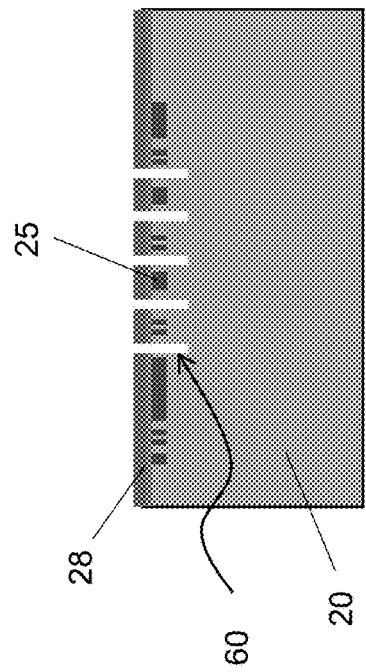
FIGS. 1A, 1B, 1C, 1D, 1E, 1F, 1G, 1H, 1I and 1J show schematic cross sectional views of the various stages of a sequential manufacturing operation for a MEMS device according to an embodiment of the present disclosure.
Figure 1D:
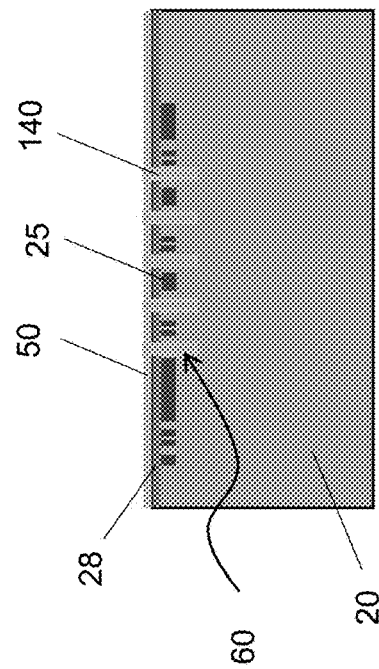
Figure 1A:
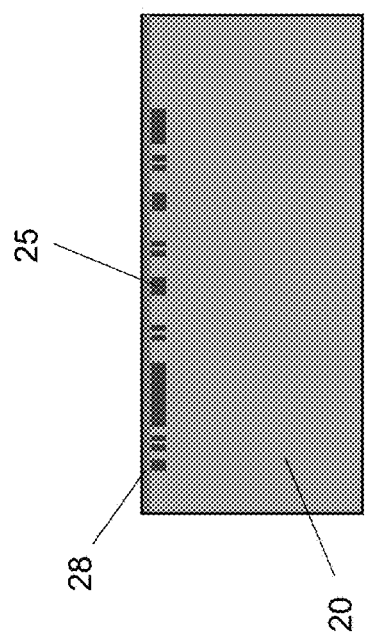

As shown in FIG. 1A, an electronic circuit 25 is formed in a front surface region of a circuit substrate 20. The electronic circuit 25 includes transistors including semiconductor field effect transistors, such as complementary metal-oxide-semiconductor (CMOS) devices. In some embodiments, the circuit substrate 20 is made of a crystalline silicon or any other suitable semiconductor material.

After the electronic circuit 25 is formed, one or more passivation films 28 are formed over the front surface of the circuit substrate 20. In some embodiments, the one or more passivation films 28 include silicon oxide, silicon nitride, or an organic film. Then, as shown in FIG. 1B, one or more holes 60 (e.g., through-silicon vias (TSV)) are formed in the circuit substrate 20 using a mask pattern 29. The holes 60 are formed such that no metallic pattern is exposed within the holes in some embodiments.

Figure 1C:
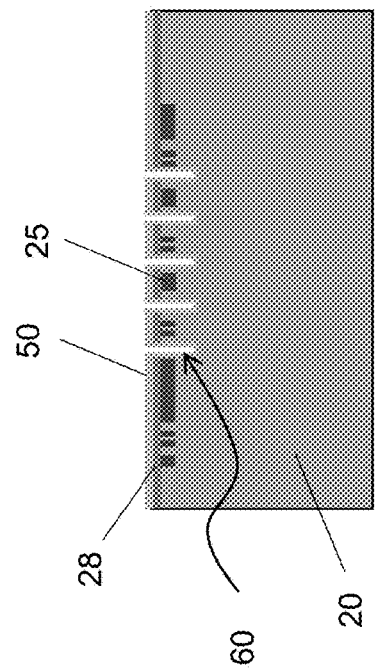

Then, as shown in FIG. 1C, a first conductive layer 50 is formed over the front side of the circuit substrate 20. In some embodiments, the first conductive layer 50 is formed on the passivation film 28. In some embodiments, the first conductive layer 50 is also formed on at least a part of the inner wall of each of the holes 60 as shown in FIG. 1C. In some embodiments, the first conductive layer 50 include one or more layers of Au, Ti, Cu, Ag and Ni or an alloy thereof. In some embodiments, the first conductive layer 50 is a gold (Au) layer formed on a Ti layer. In other embodiments, the first conductive layer 50 consists of one, two, three, four or five layers made of different materials from each other. For example, in some embodiments, the first conductive layer 50 has a layered structure of A/B/C/D/E, A/B/C/D, A/B/C, A/B or A (A/B means B on A), where each of A, B, C, D and E represents a metal or metallic material. In other embodiments, the first conductive layer 50 consists of two, three, four or five layers, in which adjacent layers are made of different materials from each other.

In some embodiments, the first conductive layer 50 is formed by chemical vapor deposition (CVD), physical vapor deposition (PVD) including sputtering, atomic layer deposition (ALD), plating or any other suitable film deposition method. In certain embodiments, a sputtering method is used. In some embodiments, each of the metal or metallic layers of the first conductive layer 50 has a thickness in a range from about 2 nm to about 100 nm.

In some embodiments, the first conductive layer 50 is conformally formed inside the holes 60 such that the inner sidewall and the bottom of the hole 60 are fully covered by the first conductive layer 50. In other embodiments, the inner sidewall and the bottom of the hole 60 are only partially covered by the first conductive layer 50 and a part of the circuit substrate (Si substrate) is exposed in the holes 60. In particular, a lower part of the inner sidewall of the holes 60 is not covered by the first conductive layer 50, in some embodiments.

In some embodiments, a filling layer 140 is formed to fill the holes 60 as shown in FIG. 1D. In some embodiments, the filling layer 140 includes silicon oxide, silicon nitride or any other suitable insulating material. In certain embodiments, silicon oxide is used. In some embodiments, a blanket layer of a filling material is formed over the first conductive layer 50 and then a planarization operation, such as a chemical mechanical polishing process or an etch-back process, is performed to leave the filling material only inside the holes 60, as shown in FIG. 1D. In other embodiments, the filling material is not formed.

Figure 1E:
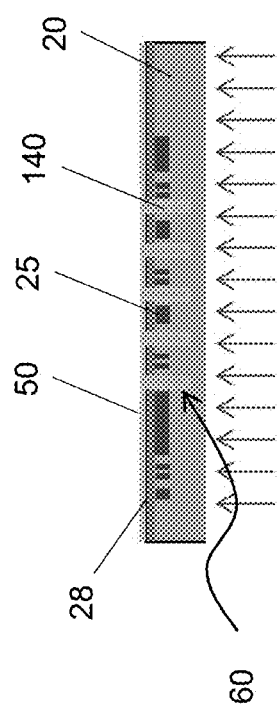

Then, the back side of the circuit substrate 20 is thinned by a grinding or a polishing process, as shown in FIG. 1E. The remaining thickness of the thinned circuit substrate 20 is in a range from about 100 μm to about 500 μm in some embodiments.

Figure 1F:
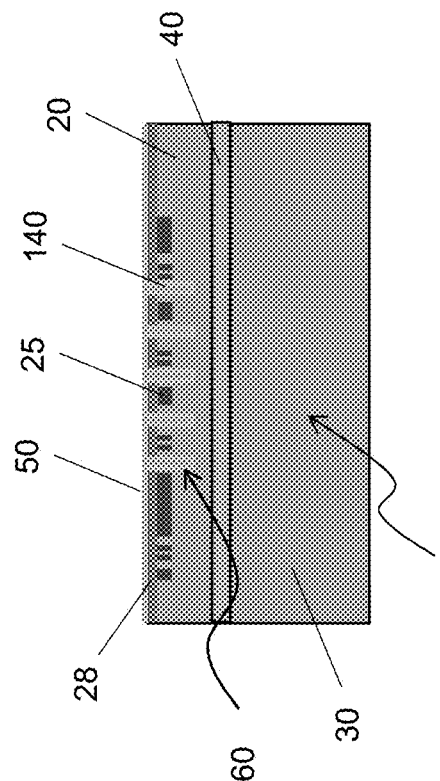

Next, as shown in FIG. 1F, the thinned circuit substrate 20 is bonded to a support substrate 30 via a bonding layer 40. In some embodiments, as shown in FIG. 1C, the bonding layer 40 is silicon oxide formed on the surface of the support substrate 30 by, for example, a thermal oxidation process or a chemical vapor deposition (CVD) process. In other embodiments, the bonding layer 40 is formed on the back side of the circuit substrate 20 by, for example, a CVD process. In some embodiments, the thickness of the bonding layer 40 is in a range from about 500 nm to about 5 μm and is in a range from about 1 μm to about 2 μm in other embodiments.

Figure 1G:
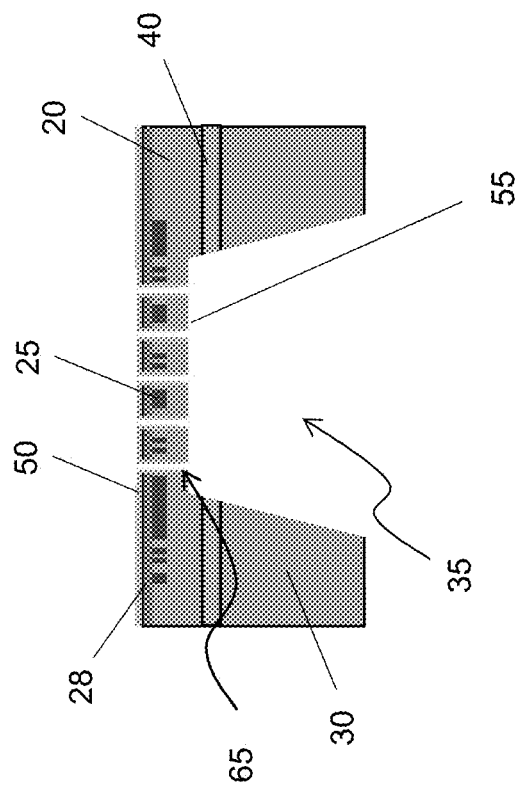

Then, as shown in FIG. 1G, the back side of the support substrate 30 is recessed by using one or more lithography and etching operations. In some embodiments, the etching operation includes plasma dry etching or wet etching. In some embodiments, wet etching utilizes a tetramethylammonium hydroxide (TMAH) or KOH solution. In some embodiments, the bonding layer 40 functions as an etch stop layer for forming the recess 35 as shown in FIG. 1G.

Figure 1H:
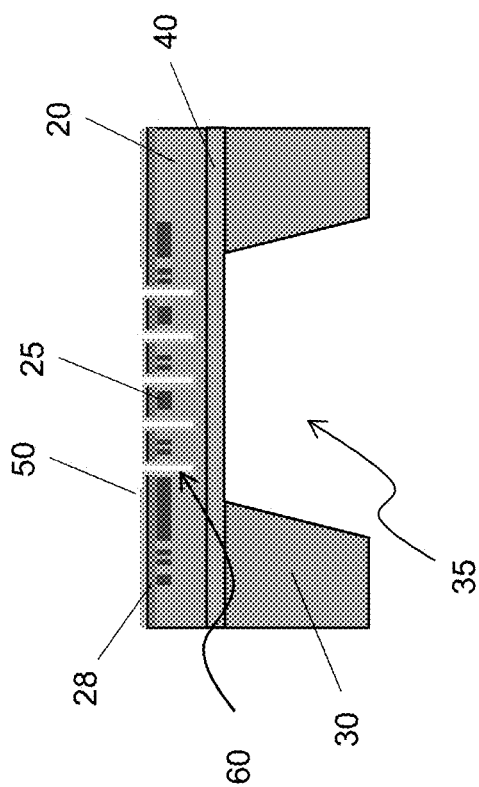

The bonding layer 40 is subsequently removed by a suitable etching operation. Then, the backside of the circuit substrate 20 is etched to expose the filling material 140 filled in the holes 60, and the filling materials 140 are removed, thereby forming through holes 65, as shown in FIG. 1H.

Figure 1J:
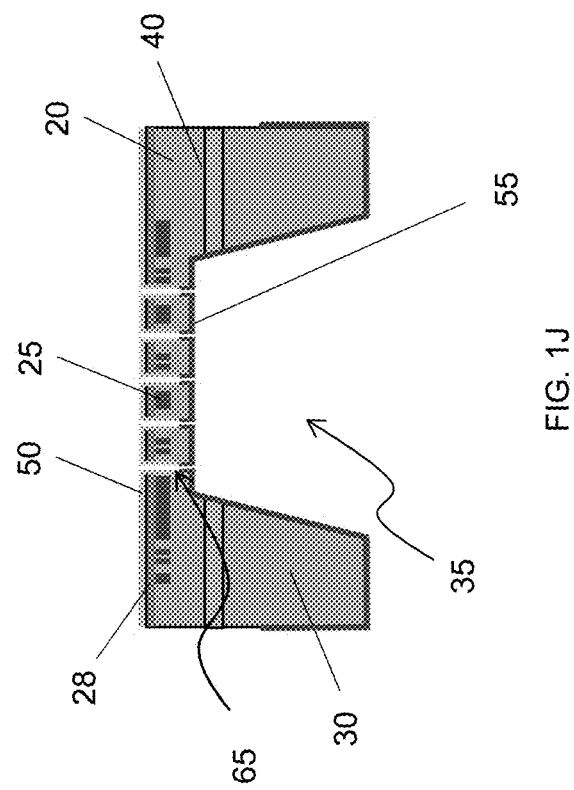
Figure 1I:
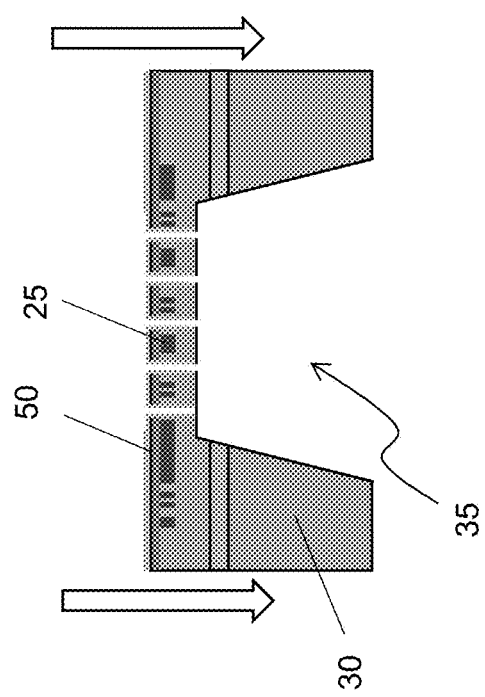

In some embodiments, a plurality of MEMS devices are formed on one wafer and the wafer is cut by sawing (a dicing operation) into individual MEMS devices (chips), as shown by the arrows in FIG. 1I. The dicing operation is performed prior to the recess etching for forming the recess 35 in some embodiments.

After the dicing operation, a second conductive layer 55 is formed inside the recess, the bottom of the support substrate 30 and side faces of the chips, as shown in FIG. 1J. In some embodiments, the second conductive layer 55 includes one or more layers of Au, Ti, Cu, Ag and Ni or an alloy thereof. In some embodiments, the second conductive layer 55 is a gold (Au) layer formed on a Ti layer. In other embodiments, the second conductive layer 55 consists of one, two, three, four or five layers made of different materials from each other. For example, the second conductive layer 55 has a layered structure of A/B/C/D/E, A/B/C/D, A/B/C, A/B or A (A/B means B on A), where each of A, B, C, D and E represents a metal or metallic material. In other embodiments, the second conductive layer 55 consists of two, three, four or five layers, in which adjacent layers are made of different materials from each other. For example, the second conductive layer 55 has a layered structure of A/B/A/B, A/B/B/A, A/B or A/A. In some embodiments, the film structure of the second conductive layer 55 is the same as that of the first conductive layer, and in other embodiments, the film structure of the second conductive layer 55 is different from that of the first conductive layer. In some embodiments, at least one metal layer of the first conductive layer 50 is the same as that of the second conductive layer 55.

In some embodiments, the second conductive layer 55 is formed by CVD, PVD including sputtering, ALD, plating or any other suitable film deposition method. In certain embodiments, a sputtering method is used. In some embodiments, each of the metal or metallic layers of the second conductive layer 55 has a thickness in a range from about 2 nm to about 100 nm.

In some embodiments, the second conductive layer 55 is conformally formed inside the through holes 65 such that the inner sidewall of the through holes 65, on which the first conductive layer 50 is at least partially formed, are fully covered by the second conductive layer 55. In other embodiments, the inner sidewall of the through holes 65 is only partially covered by the second conductive layer 55 and a part of the first conductive layer 50 is exposed in the through holes 65. Since the second conductive layer 55 is formed after the dicing operation, the second conductive layer is formed on the side faces of the chip.

Figure 1K:
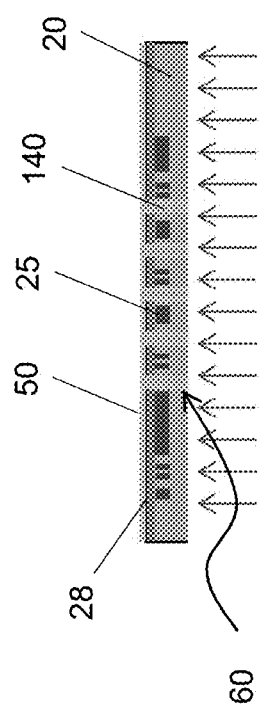
FIGS. 1K, 1L, 1M, 1N, 1O and 1P show schematic cross sectional views of the various stages of a sequential manufacturing operation for a MEMS device according to another embodiment of the present disclosure.
Figure 1L:
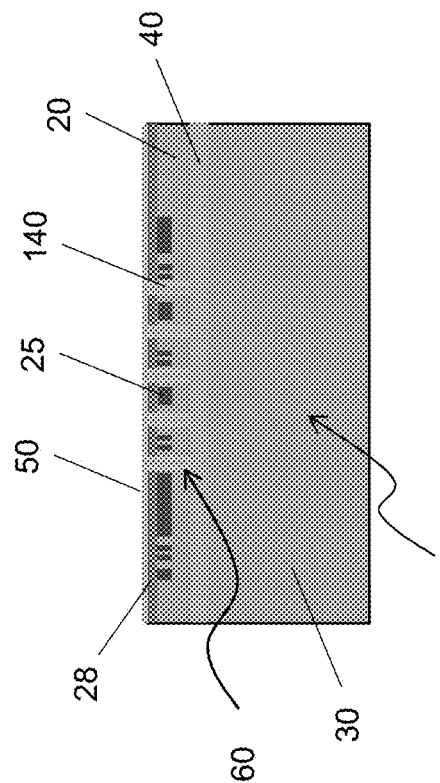
Figure 1M:
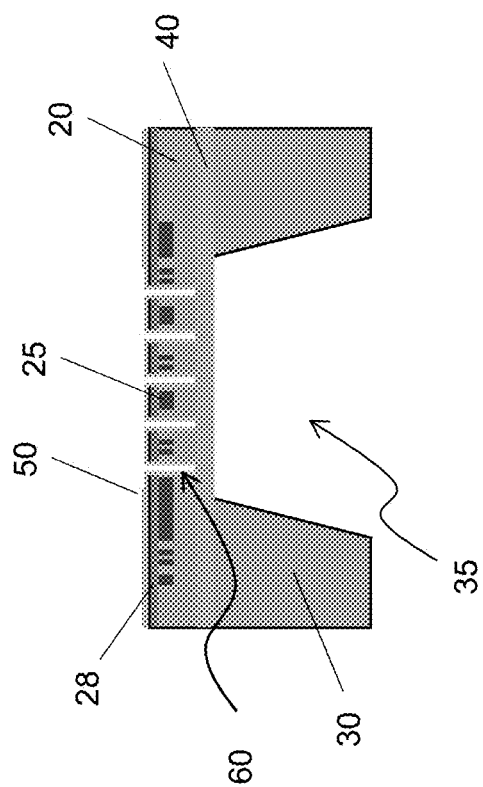
Figure 1N:
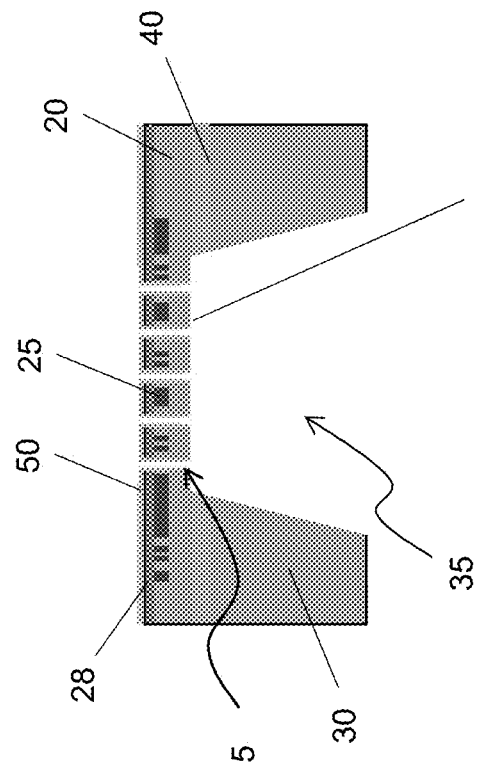
Figure 1P:
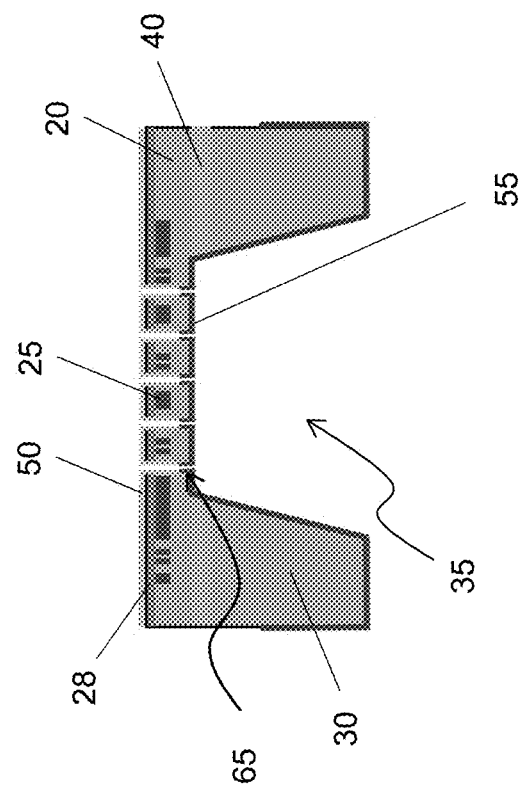
Figure 1O:
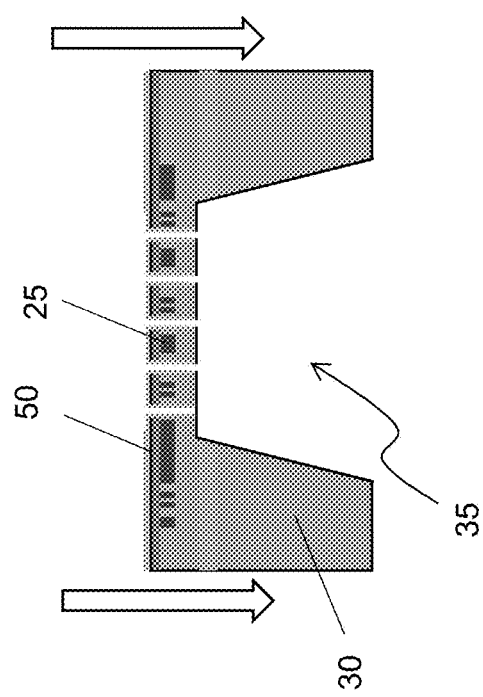

In other embodiments, in the backside thinning operation explained with respect to FIG. 1E, the bottoms of the holes 60, in particular the filling materials 140, are exposed, as shown in FIG. 1K. In such a case, the bonding layer 40 is in contact with the filling material 140 as shown in FIG. 1L. Then, similar to FIG. 1G, the back side of the support substrate 30 is recessed by using one or more lithography and etching operations, as shown in FIG. 1M. In some embodiments, the bonding layer 40 functions as an etch stop layer for forming the recess 35 as shown in FIG. 1G. Further, the bonding layer 40 and the filling material 140 are removed by a suitable etching process, as shown in FIG. 1N. When the filling material 140 and the bonding layer 40 are made of the same material (e.g., silicon oxide), both the filling material 140 and the bonding layer 40 are removed in the same process step. In some embodiments, a wet etching process using HF or buffered HF is performed to remove the bonding layer 40 and the filling material 140, thereby forming through holes 65. Then, the dicing operation is performed as shown in FIG. 1O, and the second conductive layer 55 is formed as shown in FIG. 1P.

FIGS. 2A, 2B, 2C, 2D and 2E show schematic cross sectional views of MEMS devices manufactured according to one or more of the foregoing embodiments. Detailed description of materials, configurations, dimensions and process described with respect to FIGS. 1A-1P may be omitted.

Figure 2A:
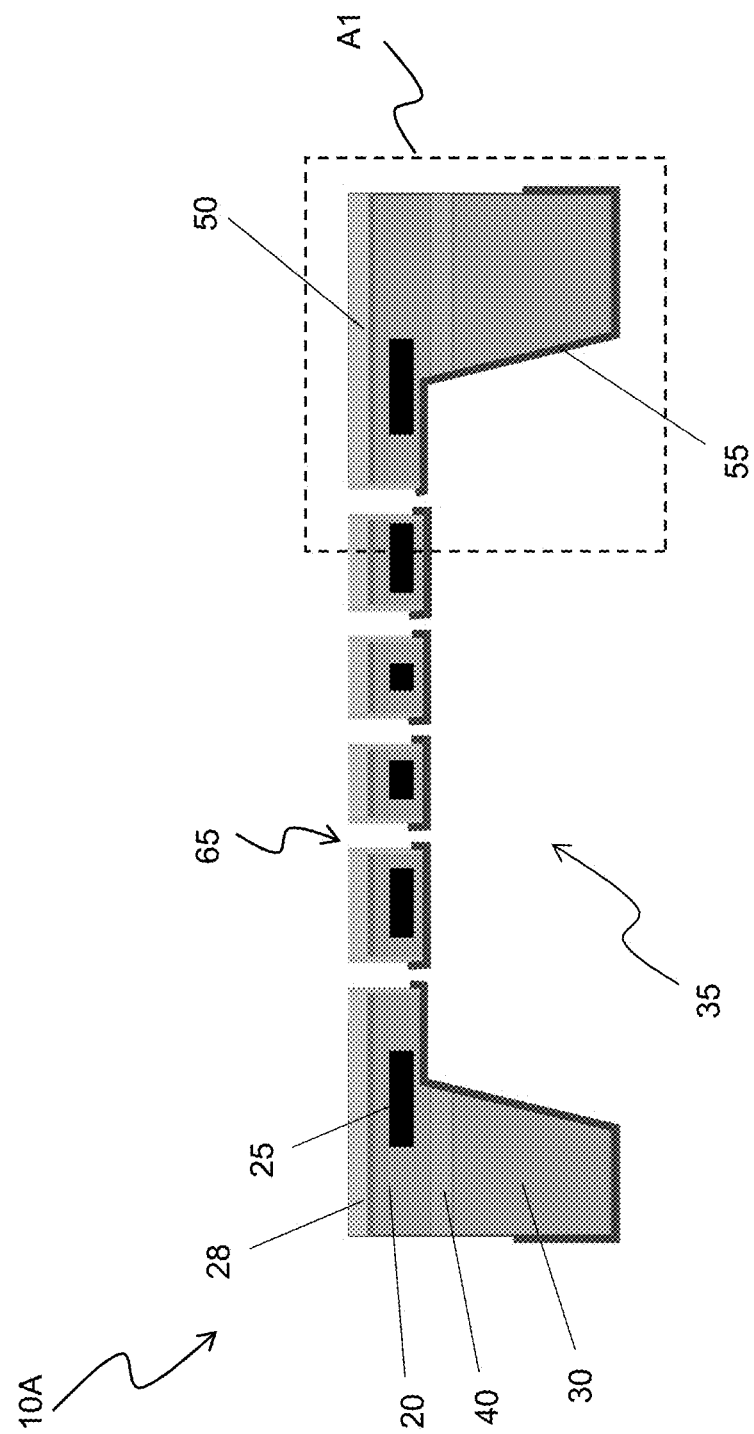

As shown in FIG. 2A, the MEMS device 10A includes the circuit substrate 20 in which an electronic circuit 25 is formed, and the support substrate 30 having the recess 35. In some embodiments, an insulating layer 40 (the bonding layer) is disposed between the circuit substrate 20 and the support substrate 30. In some embodiments, the insulating layer 40 is one or more of: a silicon oxide layer, a silicon nitride layer, any other metal oxide and nitride layer. In some embodiments, one or more through holes 65 are disposed passing through the circuit substrate 20. In some embodiments, the through holes 65 are arranged in an n×m matrix in a plan view, where n and m are integers of 2 or more and equal to or less than, for example, 128.

The thickness of the circuit substrate 20 is in a range from about 100 μm to about 500 μm in some embodiments. The thickness of the support substrate 30 is in a range from about 300 μm to about 1500 μm in some embodiments. In some embodiments, the thickness of the insulating layer 40 is in a range from about 500 nm to about 5 μm and is in a range from about 1 μm to about 2 μm in other embodiments. In some embodiments, the total thickness of the MEMS device is in a range from about 500 μm to about 2 mm and is in a range from about 600 μm to about 1200 μm in other embodiments.

In some embodiments, the first conductive layer 50 is formed on a front surface of the circuit substrate 20 and the second conductive layer 55 is formed on a back surface of the support substrate 30 as shown in FIG. 2A. In some embodiments, the first conductive layer 50 is also formed on at least a part of an inner wall of the through holes 65 and the passivation film 28, and the second conductive layer 55 is also formed on at least a part of the inner wall of the through holes 65.

In some embodiments, as shown in FIG. 2A, the insulating layer 40 is in contact with the second conductive layer 55 and is in contact with the circuit substrate 20. In other embodiments, the insulating layer 40 remains at the bottom of the cavity 35 and the second conductive layer 55 is not in contact with the circuit substrate 20.

In some embodiments, the circuit substrate 20 includes electronic circuitry 25, such as a signal processing circuit and/or an amplifier circuit, formed by electronic circuitry. In some embodiments, the recess 35 has a rectangular (e.g., square) shape in plan view. In some embodiments, at least one of the circuit substrate 20 and the support substrate 30 is made of a crystalline silicon.

FIGS. 2B-2D are enlarged views of the area A1 of FIG. 2A. In some embodiments, the inner sidewall of the through hole 65 is fully covered by the first conductive layer 50 and the second conductive layer 55. In some embodiments, when a sputtering method is used to form the first and second conductive layers, the conductive layers are not uniformly formed on the inner sidewall of the through holes 65, depending on an aspect ratio T1/T3. T1 is a depth of the through hole 65 from the upper surface of the passivation film 28 and the bottom of the circuit substrate 20, and T3 is a diameter of the through hole 65. In some embodiments, the first and/or second conductive layers has a tapered shape. In other embodiments, the thickness of the first and/or second conductive layers is substantially uniform inside the through hole 65, as shown in FIGS. 2C and 2D. In FIG. 2C, the first conductive layer 50 partially covers the inner sidewall of the through hole 65, in FIG. 2D, the first conductive layer 50 fully covers the inner sidewall of the through hole 65. Since the second conductive layer 55 is formed from the back side of the circuit substrate 20, even if the first conductive layer 50 does not fully cover the inner sidewall of the through hole 65, the inner sidewall of the through hole 65 is fully covered by a conductive material. Since the first and second conductive layers are coupled to each other and fully cover the inner sidewall of the through holes, it can improve heat dissipation of the MEMS device.

In some embodiments, a coverage amount D1 of the first conductive layer 50 over the inner sidewall including the thickness of the first conductive layer 50 is equal to or greater than a coverage amount D2 of the second conductive layer 55 over the inner sidewall including the thickness of the second conductive layer 55. In some embodiments, D1 and D2 are more than about 50% of T3. In some embodiments, the second conductive layer 55 overlaps the first conductive layer 50, and an overlapping amount D3 is about 10%-90% of the depth T1. In some embodiments, the total thickness of a conductive layer on the inner sidewall of the through hole 65 is not uniform. In some embodiments, the thickness of the conductive layer on the inner sidewall of the through hole 65 at the overlapped area is greater than the thickness of each of the single layers of the first conductive layer 50 and the second conductive layer 55.

In some embodiments, the angle θ1 at the bottom of the recess 35 is more than 0 degrees to less than 180 degrees, and is more than 60 degrees to equal to or less than 90 degrees.

In some embodiments, the second conductive layer 55 covers a part of the outer side face of the MEMS device 10A, while no first conductive layer 50 is disposed on the outer side face, as shown in FIG. 2B. In some embodiments, the distance D4 from the bottom to the top of the second conductive layer 55 is equal to or smaller than the total thickness T2 of the MEMS device 10A from the top of the first conductive layer 50 to the bottom of the second conductive layer 55. In some embodiments, the distance D5 from the interface between the insulating layer 40 and the circuit substrate 20 to the top end of the second conductive layer 55 is greater than zero. In other words, the second conductive layer 55 fully covers the side face of the insulating layer 40. In some embodiments, the second conductive layer 55 on the outer side face is not in contact with the first conductive layer 50 formed on the passivation layer 28. In other embodiments, the second conductive layer 55 on the outer side face is in contact with the first conductive layer 50 formed on the passivation layer 28. The coverage on the outer side face of the MEMS device 10A by the second conductive layer 55 improves heat dissipation.

In some embodiments, the MEMS device can be manufactured by the operations as shown below. After the electronic circuit is formed over a circuit substrate, one or more planar electrodes are formed and one or more passivation layers are formed. The electrode is electrically connected to the electronic circuit formed in the circuit substrate. In some embodiments, the circuit substrate includes a crystalline silicon substrate. In some embodiments, one or more openings are formed over the electrode in the one or more passivation layers. In some embodiments, the electrodes are made of one or more layers of Cu, Al, Au, Ni, Ag, or other suitable conductive material. The passivation layers include silicon nitride, SiON, silicon oxide, aluminum nitride or an organic material.

Then, one or more holes for through-silicon-vias (TSVs) are formed in regions other than the electrodes. The TSV holes are formed by one or more lithography and etching operations. In some embodiments, the TSV holes are arranged in an n×m matrix in a plan view, where n and m are integers of 2 or more and equal to or less than, for example, 128. The depth of the TSV's is in a range from about 20 μm to about 100 μm from the top of the passivation layer in some embodiments. In some embodiments, the depth is determined such that after a thinning process of the back side of the circuit substrate is subsequently performed, the bottom of the TSV holes are exposed. In some embodiments, the shape of the TSV holes in plan view is circular or rectangular (e.g., square). In some embodiments, the TSV holes are tapered, having a larger opening than the bottom. In some embodiments, a diameter (or a length of sides) of the TSV holes at the opening is in a range from about 100 nm to about 10,000 nm.

Then, a first conductive layer is formed over the electrodes, the passivation layer and inside the TSV holes. Then, a filling layer is formed to fill the TSV holes. The first conductive layer has the same as or similar functionality to the first conductive layer 50 shown in FIGS. 1A-1D. In some embodiments, the first conductive layer includes one or more layers of Au, Ti, Cu, Ag and Ni. In certain embodiments, a gold layer formed over a Ti layer is used as the first conductive layer. In some embodiments, the thickness of the Ti layer is in a range from about 50 nm to about 200 nm and is in a range from about 80 nm to about 120 nm in other embodiments. In some embodiments, the thickness of the gold (Au) layer is in a range from about 10 nm to about 400 nm and is in a range from about 150 nm to about 250 nm in other embodiments. In some embodiments, the filling layer includes silicon oxide or any other suitable insulating material. In some embodiments, a blanket layer of a filing material is formed over the first conductive layer and then a planarization operation, such as a chemical mechanical polishing process or an etch-back process, is performed to leave the filling material only inside the TSV holes. In other embodiments, the filling material also remains on a concave portion over the electrodes.

Next, the conductive layer is patterned to form one or more openings over the passivation layer near the TSV hole to partially expose the passivation layer. Then, an insulating layer is formed and patterned to form island shaped insulating patterns to cover the openings. In some embodiments, the insulating patterns include silicon nitride.

Further, a first carrier bonding layer is formed over the front surface of the circuit substrate on which the conductive layer and the patterns are formed and then a first carrier substrate is attached. The first carrier substrate is a glass substrate, a ceramic substrate, a semiconductor substrate or a resin substrate in some embodiments. In some embodiments, the first carrier bonding layer includes an organic material, silicon oxide or any other suitable material.

Then, the backside of the circuit substrate is thinned by a grinding or a polishing (e.g., CMP) operation. In some embodiments, after thinning, the circuit substrate has a remaining thickness in a range from about 20 μm to about 100 μm, and the remaining thickness is in a range from about 40 μm to about 60 μm in other embodiments. The bottom of the filling material layer filled in the TSV hole is exposed. In other embodiments, after the thinning operation, the first carrier substrate is attached to the front surface of the circuit substrate.

Further, a bonding layer is formed on the thinned back surface of the circuit substrate. The bonding layer has the same as or similar functionalities to the bonding layer 40 shown in FIGS. 1A-2F. In some embodiments, the bonding layer includes silicon oxide formed by, for example, a CVD process.

Then, a support substrate is prepared and bonded to the circuit substrate through the bonding layer (oxide fusion bonding). In some embodiments, the support substrate is made of a crystalline silicon. After the oxide fusion bonding, the first carrier substrate and the first carrier bonding layer are removed. When the first carrier bonding layer is made of an organic material, the first carrier substrate and the first carrier bonding layer are removed by a wet treatment. The bonding layer is connected to the filling material layer in the TSV holes. In some embodiments, the bonding layer and the filling material layer are made of the same material.

In other embodiments, the bonding layer is formed on the support substrate or on both the support substrate and the circuit substrate. In some embodiments, the thickness of the support substrate without the bonding layer is in a range from about 200 μm to about 1.8 mm and is in a range from about 500 μm to about 750 μm in other embodiments.

Next, a first hard mask layer is formed and then a second hard mask layer is formed over the front surface of the circuit substrate. In some embodiments, the first hard mask layer includes silicon oxide and the second hard mask layer includes polysilicon or amorphous silicon. In some embodiments, the silicon oxide hard mask layer is formed by a CVD process and then a planarization operation, such as a CMP operation, is performed. Similarly, in some embodiments, the polysilicon hard mask layer is formed by chemical vapor deposition (CVD) and then a CMP operation is optionally performed. In some embodiments, the thickness of the polysilicon hard mask layer is in a range from about 30 μm to about 70 μm.

Then, by using one or more lithography and etching operations, the second hard mask layer and the first hard mask layer are patterned to form one or more openings over the electrode. In some embodiments, the size of the opening is greater than the size of the opening formed in the passivation layer over the electrode. Further, in some embodiments the insulating pattern is partially exposed in the opening.

Next, one or more conductive layers are formed in the openings. In some embodiments, the conductive layers include gold or a gold alloy (e.g., AuCu and AuNi) formed by a plating operation (electroplating or electroless plating). In some embodiments, the thickness of the plated conductive layer is in a range from about 20 μm to about 50 μm. In some embodiments, the thickness (height) of the plated conductive layer is smaller than the top of the second hard mask layer.

Further, part of the plated layer over one or more electrodes is covered by a mask pattern. In some embodiments, the mask pattern includes a photo resist pattern. Then, an additional conductive layer is formed over the conductive plating layer. In some embodiments, the additional conductive layer is formed by a plating operation (electroplating or electroless plating). In some embodiments, the additional conductive layer is made of the same material as the plated conductive layer, and includes gold or a gold alloy (e.g., AuCu, AuNi). In other embodiments, the additional conductive layer is made of a different material than the plated conductive layer. Then, the photo resist pattern is removed.

In some embodiments, the thickness of the additional conductive layer is in a range from about 10 μm to about 30 μm. In some embodiments, the total thickness (height) of the plated conductive layer and the additional conductive layer is smaller than the top of the second hard mask layer.

Then, a second carrier bonding layer is formed over the front side of the circuit substrate, and then a second carrier substrate is attached to the front side of the circuit substrate via the second carrier bonding layer. The second carrier substrate is a glass substrate, a ceramic substrate, a semiconductor substrate or a resin substrate in some embodiments. In some embodiments, the second carrier bonding layer includes an organic material, silicon oxide or any other suitable material.

Then, the entire substrate is flipped vertically, and then the backside of the support substrate is patterned to form a recess. In some embodiments, the recess is formed by one or more lithography and etching operations, using a mask pattern. In some embodiments, the mask pattern is made of a photo resist.

In some embodiments, the etching operation includes plasma dry etching or wet etching. In some embodiments, the bonding layer functions as an etch stop layer for forming the recess. When a plasma dry etching process is used to form the recess, the plasma etching substantially stops at the bonding layer, and thus plasma damage on the electronic circuit formed in the circuit substrate can be prevented.

In some embodiments, after the recess etching stops at the bonding layer, the bonding layer is further etched by one or more dry etching or wet etching operations. In some embodiments, the etching of the bonding layer has a high selectivity with respect to the circuit substrate (e.g., Si). For example, the etching rate of the bonding layer is 10 times or more the etching rate of the circuit substrate. In some embodiments, when the bonding layer is made of silicon oxide, a wet etching process using HF or buffered HF is performed to suppress damage to the electronic circuit formed in the circuit substrate. When removing the bonding layer, the filling material layer in the TSV holes is also removed when the filling material layer is made of the same material as the bonding layer (e.g., silicon oxide). When the filling material layer is made of a different material (e.g., silicon nitride) than the bonding layer, an additional etching operation, such as a wet etching operation, is performed to remove the filling material layer.

After the filling material layer is removed from TSV holes, a second conductive layer is formed inside the recess.

In some embodiments, the second conductive layer is formed to be in contact with the first conductive layer formed on the inner wall of each of the TSV holes. In some embodiments, the second conductive layer is also formed on inner wall of the TSV holes, where the first conductive layer is already formed. In some embodiments, the second conductive layers is made of the same as or different material than the first conductive layer and includes one or more layers of Au, Ti, Cu, Ag and Ni. In certain embodiments, a gold layer formed over a Ti layer is used as the second conductive layer. In some embodiments, the thickness of the Ti layer is in a range from about 50 nm to about 200 nm and is in a range from about 80 nm to about 120 nm in other embodiments. In some embodiments, the thickness of the gold (Au) layer is in a range from about 10 nm to about 400 nm and is in a range from about 150 nm to about 250 nm in other embodiments.

In some embodiments, a plurality of MEMS devices are formed on a Si wafer and the wafer is cut by sawing (a dicing operation) at scribe lines into individual MEMS devices (chips). In some embodiments, the dicing operation does not completely cut the second carrier bonding layer. By removing the second carrier bonding layer and thus removing the second carrier substrate, an individual MEMS device is released. In some embodiments, the dicing operation is performed before the second conductive layer is formed, and the second conductive layer is also formed at the side faces of the MEMS device.

In some embodiments, after the second carrier substrate and the second carrier bonding layer are removed, the individual MEMS device is attached on a frame. By removing the second carrier substrate and the second carrier bonding layer, the TSV holes are exposed.

In other embodiments, a silicon-on-insulator (SOI) wafer is used. In such a case, a fusion bonding process is omitted and the oxide layer of an SOI wafer functions as an etch stop layer in the recess etching. FIGS. 3A, 3B, 3C and 3D show schematic cross sectional views of the various stages of a manufacturing operation for a MEMS device according to an embodiment of the present disclosure. It is understood that additional operations can be provided before, during, and after processes shown by FIGS. 3A-3D, and some of the operations described below can be replaced or eliminated for additional embodiments of the method. The order of the operations/processes may be interchangeable. Materials, configurations, dimensions and processes described with respect to FIGS. 1A-2 can be applied to the following embodiments, and detailed description thereof may be omitted.

The SOI substrate includes a device layer (semiconductor layer) 20', an oxide layer 40' and a bulk layer (semiconductor substrate) 30' as shown in FIG. 3A.

As shown in FIG. 3A, a CMOS circuit 25 is formed in a front surface region of the device layer 20'. One or more passivation films 28 are formed over the front surface of the device layer 20'. In some embodiments, the one or more passivation films 28 include silicon oxide, silicon nitride, or an organic film. In some embodiments, holes 60 filled with a filling material 140 are formed passing through the device layer 20'. Further, one or more first conductive layers 50 are formed on the front side of the device layer and in the holes 60 as shown in FIG. 3A.

Then, as shown in FIG. 3B, the back side of the bulk layer 30' is recessed by using one or more lithography and etching operations. In some embodiments, the etching operation includes plasma dry etching or wet etching. In some embodiment, wet etching utilizes a tetramethylammonium hydroxide (TMAH) or KOH solution.

In some embodiments, the oxide layer 40' functions as an etch stop layer for forming the recess 35 as shown in FIG. 3B.

After the recess etching stops at the oxide layer 40', the oxide layer 40' is further etched by one or more dry etching or wet etching operations. During the etching of the oxide layer 40', the filling material layer 140 is also removed from the holes 60, thereby forming through holes 65, as shown in FIG. 3C.

In some embodiments, one or more second conductive layers 55 are formed on the back side of the bulk layer 30' as shown in FIG. 3D.

FIGS. 4A and 4B show schematic cross sectional views of MEMS devices according to embodiments of the present disclosure. Materials, configurations, dimensions and processes described with respect to FIGS. 1A-3D can be applied to the following embodiments, and detailed description thereof may be omitted.

In some embodiments, as shown in FIG. 4A, no insulating layer (bonding layer) 40 is disposed and one substrate 22 (e.g., a bulk silicon substrate) is used.

In some embodiments, as shown in FIG. 4B, the first conductive layer 50 and the second conductive layer 55 are made of the same material (e.g., one layer of the same metal or metallic material), and thus there is no observable interface between the first conductive layer 50 and the second conductive layer 55 at the overlapped area inside the through hole 65.

FIGS. 5, 6, 7, 8, 9, 10, 11, 12, 13, 14, 15, 16, 17, 18, 19, 20, 21, 22, 23 and 24A show schematic cross sectional views and FIG. 24B shows a plan view of the various stages of a sequential manufacturing operation for a MEMS device according to an embodiment of the present disclosure. It is understood that additional operations can be provided before, during, and after processes shown by FIGS. 5-24B, and some of the operations described below can be replaced or eliminated for additional embodiments of the method. The order of the operations/processes may be interchangeable. Materials, configurations, dimensions and processes described with respect to FIGS. 1A-4B can be applied to the following embodiments, and detailed description thereof may be omitted.

Figure 5:
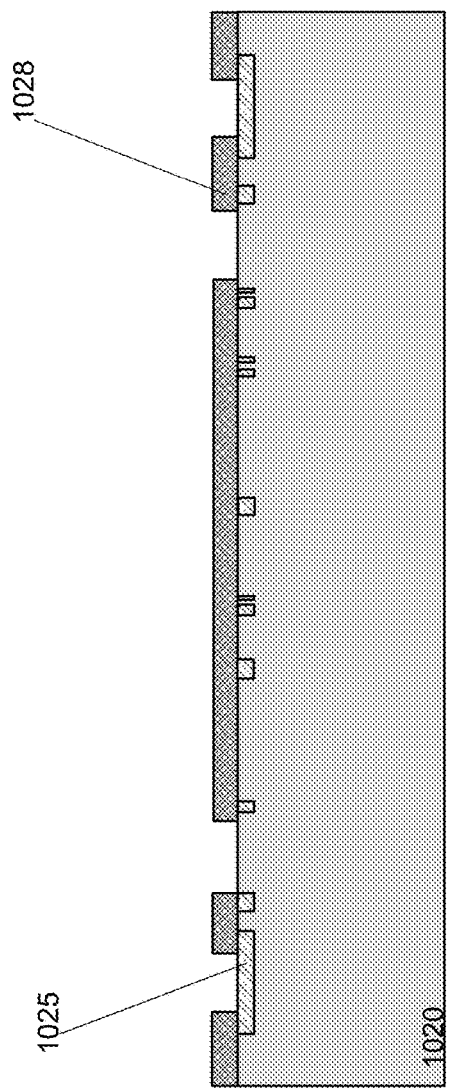

Similar to FIG. 1A, one or more electronic circuits 1025 are formed in a front surface region of a circuit substrate 1020, as shown in FIG. 5. The electronic circuits 1025 include transistors including semiconductor field effect transistors, such as complementary metal-oxide-semiconductor (CMOS) devices. In some embodiments, the circuit substrate 1020 is made of a crystalline silicon or any other suitable semiconductor material.

Figure 6:
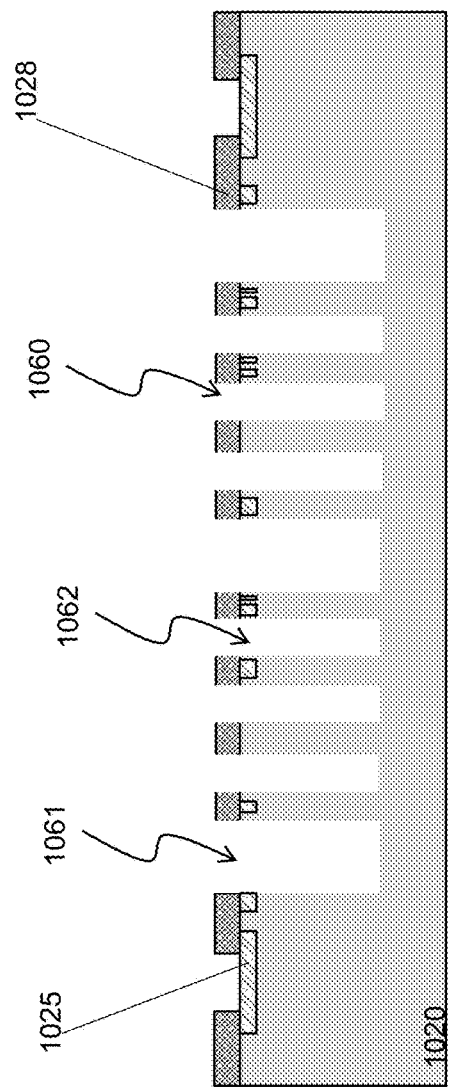

After the electronic circuits 1025 are formed, one or more passivation films 1028 are formed over the front surface of the circuit substrate 1020, as shown in FIG. 5. In some embodiments, the one or more passivation films 1028 include silicon oxide, silicon nitride, or an organic film. Then, similar to FIG. 1B, one or more holes 1060 (e.g., TSVs) are formed in the circuit substrate 1020, as shown in FIG. 6. The holes 1060 are formed such that no metallic pattern is exposed within the holes in some embodiments. In some embodiments, the holes 1060 include one or more first holes 1061 for TSV electrodes and one or more second holes 1062 for heat dissipation through holes.

Figure 7:
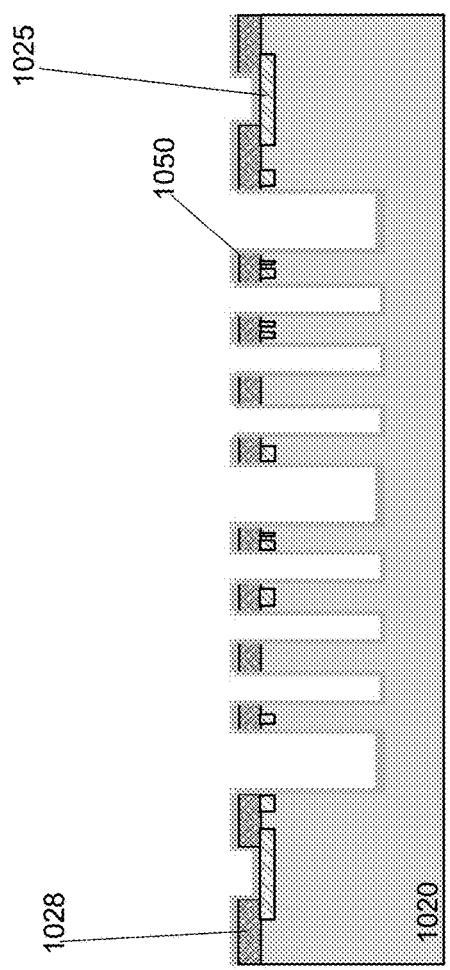

Then, similar to FIG. 1C, a first conductive layer 1050 is formed over the front side of the circuit substrate 1020, as shown in FIG. 7. In some embodiments, the first conductive layer 1050 is formed on the passivation film 1028. In some embodiments, the first conductive layer 1050 is also formed on at least a part of the inner wall of each of the holes 1060 as shown in FIG. 7. In some embodiments, the first conductive layer 1050 includes one or more layers of Au, Ti, Cu, Ag and Ni or an alloy thereof. In some embodiments, the first conductive layer 1050 is a gold (Au) layer formed on a Ti layer. In other embodiments, the first conductive layer 1050 consists of one, two, three, four or five layers made of different materials from each other. For example, in some embodiments, the first conductive layer 50 has a layered structure of A/B/C/D/E, A/B/C/D, A/B/C, A/B or A (A/B means B on A), where each of A, B, C, D and E represents a metal or metallic material. In other embodiments, the first conductive layer 1050 consists of two, three, four or five layers, in which adjacent layers are made of different materials from each other. In certain embodiments, the first conductive layer is a three layer structure of Ti/Au/Ti.

In some embodiments, the first conductive layer 1050 is formed by CVD, PVD, ALD, plating or any other suitable film deposition method. In certain embodiments, a sputtering method is used. In some embodiments, each of the metal or metallic layers of the first conductive layer 1050 has a thickness in a range from about 2 nm to about 100 nm.

In some embodiments, the first conductive layer 1050 is conformally formed inside the holes 1060 such that the inner sidewall and the bottom of the hole 1060 are fully covered by the first conductive layer 1050. In other embodiments, the inner sidewall and the bottom of the hole 1060 are only partially covered by the first conductive layer 1050 and a part of the circuit substrate (Si substrate) is exposed in the holes 1060. In particular, a lower part of the inner sidewall of the holes 1060 is not covered by the first conductive layer 1050, in some embodiments. In some embodiments, the first conductive layer 1050 functions as a seed layer for electroplating in the subsequent process.

Figure 8:
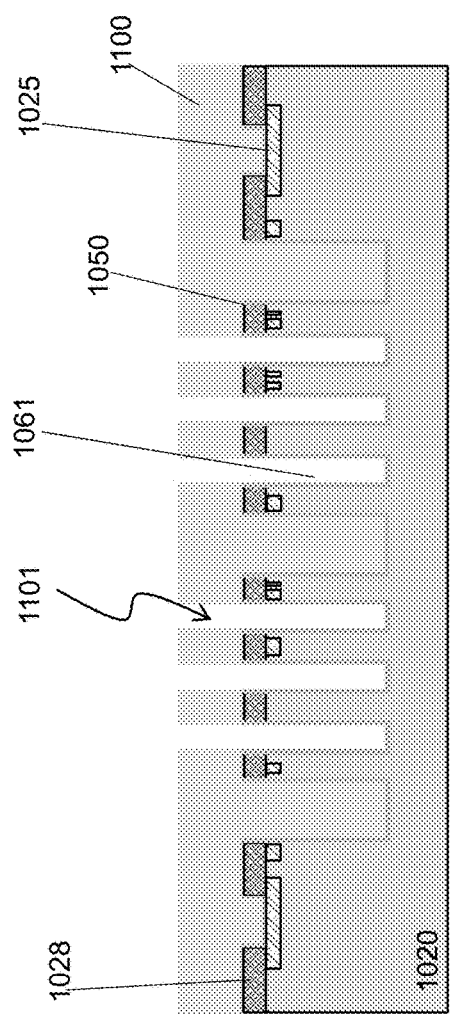

In some embodiments, a first mask layer 1110 having one or more openings 1101 over the first holes 1061 is formed over the front side of the circuit substrate 1020, as shown in FIG. 8. In some embodiments, the first mask layer 1110 is a photo resist layer.

Figure 9:
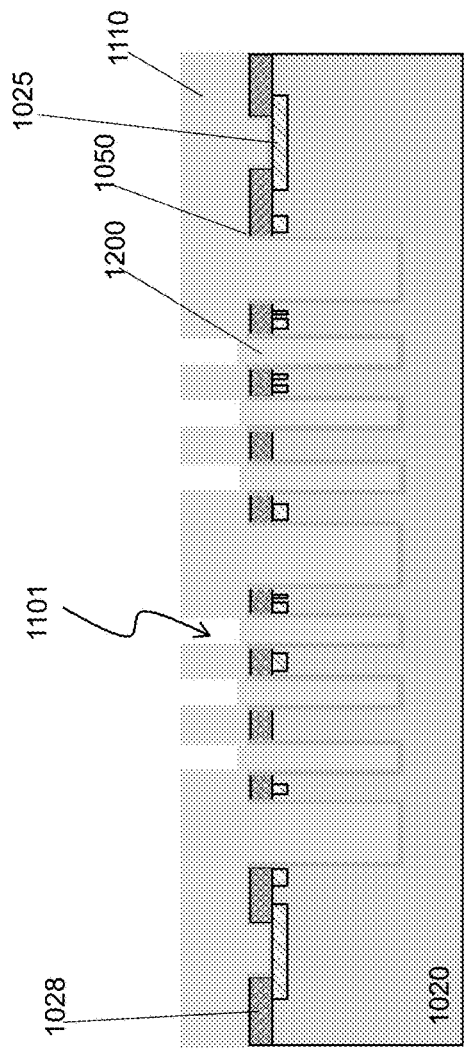

Then, a third conductive layer 1200 is formed to fill the first holes 1061 as shown in FIG. 9. In some embodiments, the third conductive layer 1200 includes one or more layers of Au, Ti, Cu, Ag and Ni or an alloy thereof. In some embodiments, the third conductive layer 1200 is a copper (Cu) or a Cu alloy layer. In other embodiments, the third conductive layer 1200 consists of one, two, three, four or five layers made of different materials from each other. For example, in some embodiments, the third conductive layer 1200 has a layered structure of A/B/C/D/E, A/B/C/D, A/B/C, A/B or A (A/B means B on A), where each of A, B, C, D and E represents a metal or metallic material. In other embodiments, the third conductive layer 1200 consists of two, three, four or five layers, in which adjacent layers are made of different materials from each other. In some embodiments, the third conductive layer 1200 is formed by electroplating using the first conductive layer 1050 as a seed layer. In some embodiments, as shown in FIG. 9, the top of the third conductive layer 1200 is located above the upper surface of the passivation layer 1028. In some embodiments, the third conductive layer 1200 functions as a TSV electrode. After the third conductive layer 1200 is formed, the first mask layer 1100 is removed.

Figure 10:
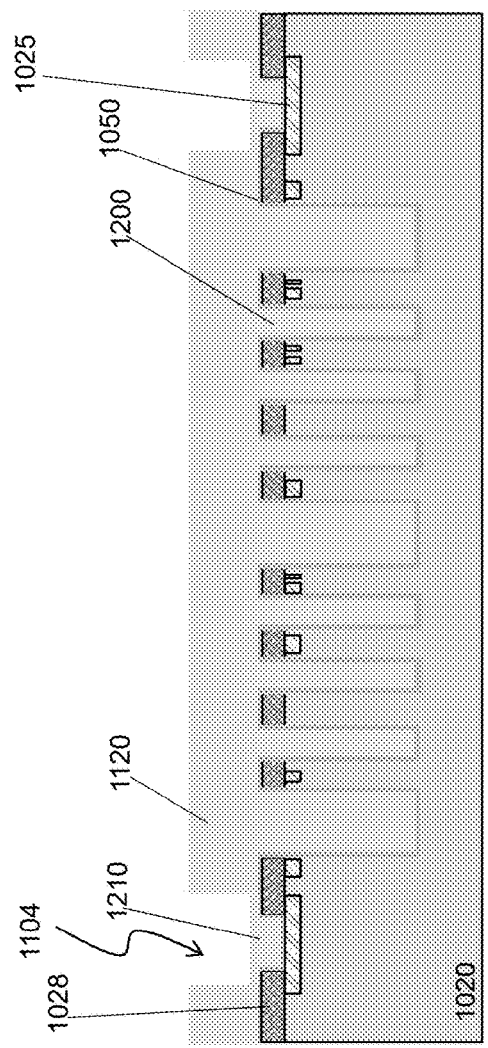

Next, as shown in FIG. 10, a second mask layer 1120 having one or more openings 1104 is formed over the front side of the circuit substrate 1020. In some embodiments, the second mask layer 1120 is a photo resist layer.

Then, a fourth conductive layer 1210 is formed to fill the first holes 1061 as shown in FIG. 10. In some embodiments, the fourth conductive layer 1210 include one or more layers of Au, Ti, Cu, Ag and Ni or an alloy thereof. In some embodiments, the fourth conductive layer 1210 is a copper (Cu) or a Cu alloy layer. In other embodiments, the fourth conductive layer 1210 consists of one, two, three, four or five layers made of different materials from each other. For example, in some embodiments, the fourth conductive layer 1210 has a layered structure of A/B/C/D/E, A/B/C/D, A/B/C, A/B or A (A/B means B on A), where each of A, B, C, D and E represents a metal or metallic material. In other embodiments, the fourth conductive layer 1210 consists of two, three, four or five layers, in which adjacent layers are made of different materials from each other. In some embodiments, the fourth conductive layer 1210 is formed by electroplating using the first conductive layer 1050 as a seed layer. In some embodiments, as shown in FIG. 10, the fourth conductive layer 1210 is electrically connected to the electronic circuit 1025. In some embodiments, the fourth conductive layer 1210 functions as an under bump metallization (UMB) layer. After the fourth conductive layer 1210 is formed, the second mask layer 1120 is removed.

Next, as shown in FIG. 11, a third mask layer 1130 having one or more openings 1106 is formed over the front side of the circuit substrate 1020. In some embodiments, the third mask layer 1130 is a photo resist layer. As shown in FIG. 11, the third mask layer 1130 covers the third and fourth conductive layers and the second holes, and unnecessary portions of the first, third and/or fourth conductive layers are removed by one or more dry and/or wet etching operations. By this etching operation, the conductive layers are appropriately isolated from each other. After the etching operation, the third mask layer 1130 is removed as shown in FIG. 12.

Figure 13:
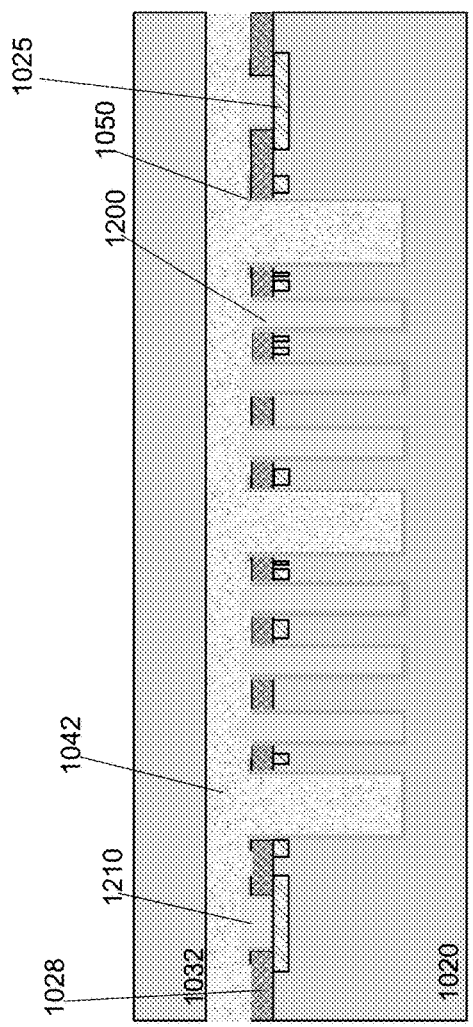

In some embodiments, as shown in FIG. 13, a first bonding layer 1042 is formed over the front side of the circuit substrate 1020 and a dummy substrate 1032 is bonded to the circuit substrate 1020 via the first bonding layer 1042. In some embodiments, the first bonding layer 1042 is silicon oxide formed by, for example, a CVD, PVD or ALD process. In some embodiments, the dummy substrate 1032 is a silicon substrate, a glass substrate or a ceramic substrate. In some embodiments, after the dummy substrate 1032 is attached, the dummy substrate 1032 is thinned by an appropriate etching and/or grinding process.

Figure 14:
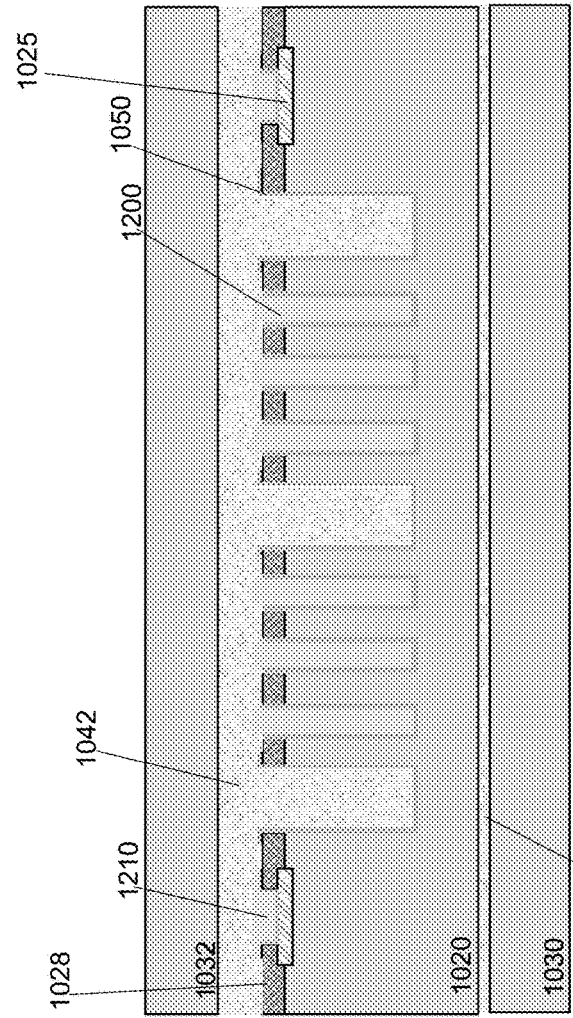

Further, as shown in FIG. 14, the circuit substrate 20 is bonded to a support substrate 1030 via a second bonding layer 1040. In some embodiments, the second bonding layer 1040 is silicon oxide formed on the surface of the support substrate 1030 by, for example, a thermal oxidation process or a CVD process. In other embodiments, the second bonding layer 1040 is formed on the back side of the circuit substrate 1020 by, for example, a CVD process. In some embodiments, the thickness of the second bonding layer 1040 is in a range from about 500 nm to about 5 μm and is in a range from about 1 μm to about 2 μm in other embodiments.

In some embodiments, before the support substrate 1030 is attached, the back side of the circuit substrate 1020 is thinned by a grinding or a polishing process, similar to FIG. 1E. The remaining thickness of the thinned circuit substrate 1020 is in a range from about 100 μm to about 500 μm in some embodiments. In some embodiments, the support substrate 1030 is attached to the back side of the circuit substrate 1020 and then the dummy substrate 1032 is attached to the front side of the circuit substrate 1020.

Figures 15, 16:
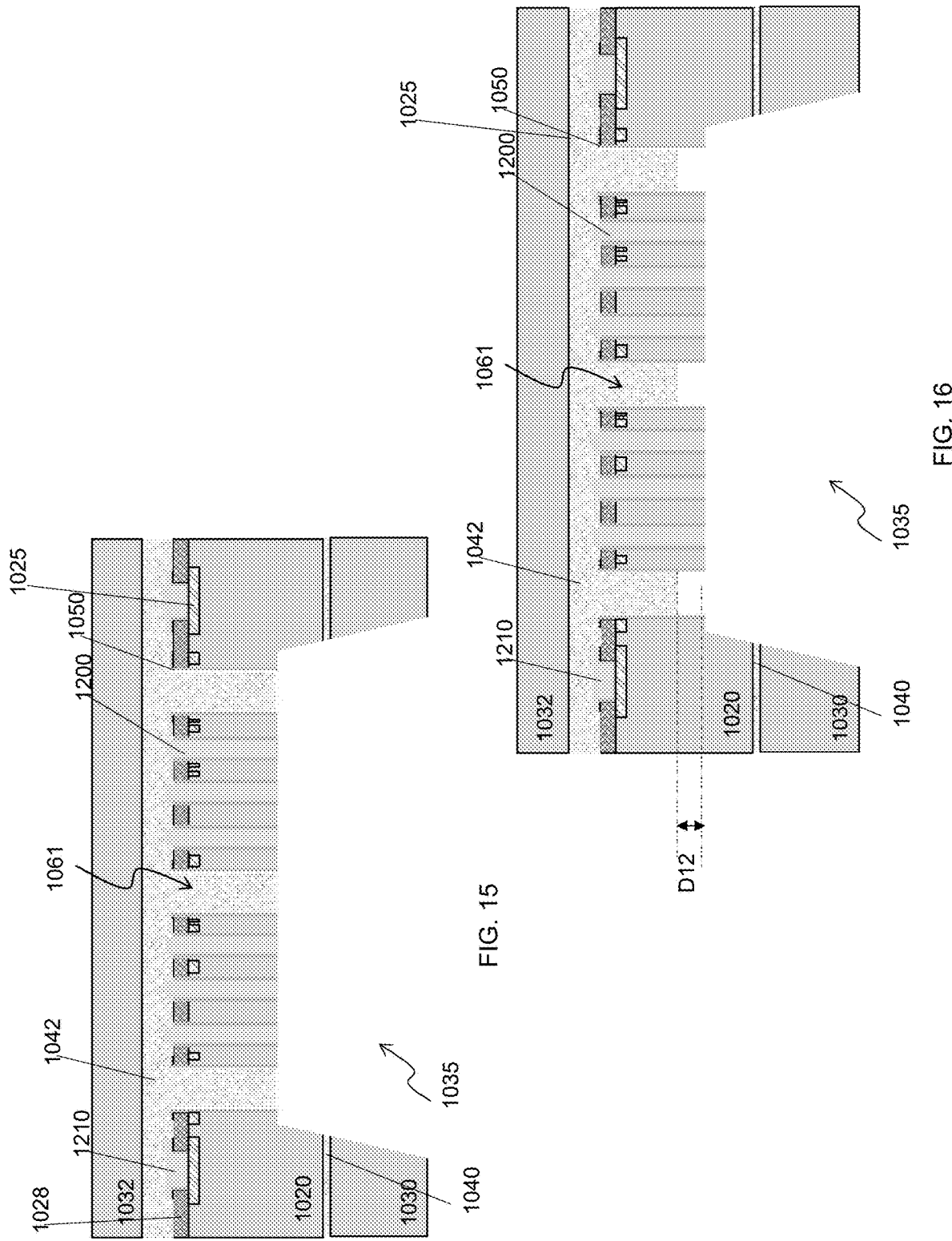

Then, the back side of the support substrate 1030 is recessed to form a recess 1035 by using one or more lithography and etching operations, as shown in FIG. 15. In some embodiments, the etching operation includes plasma dry etching or wet etching. In some embodiments, wet etching utilizes a tetramethylammonium hydroxide (TMAH) or KOH solution.

In some embodiments, the second bonding layer 1040 functions as an etch stop layer for forming the recess 1035, similar to FIG. 1G. The second bonding layer 1040 is subsequently removed by a suitable etching operation. Then, the backside of the circuit substrate 1025 is etched to expose the first and/or third conductive layers and the first boding layer 1042, as shown in FIG. 15. In some embodiments, the etching of the circuit substrate 1025 stops at the first conductive layer 1050 and then the exposed first conductive layer 1050 is further etched to expose the third conductive layers 1200 and the first bonding layer 1042.

Further, in some embodiments, the exposed first bonding layer 1042 is recessed upward by one or more dry and/or wet etching operations, as shown in FIG. 16. In some embodiments, the recessed amount D12 is the same as the coverage amount D2 shown in FIG. 2B.

In some embodiments, a plurality of MEMS devices are formed on one wafer and the wafer is cut by sawing (a dicing operation) into individual MEMS devices (chips), similar to FIG. 1I. The dicing operation is performed prior to the recess etching for forming the recess 1035 in some embodiments.

After the dicing operation, a second conductive layer 1055 is formed inside the recess 1035, the bottom of the support substrate 1030, side faces of the chips and inside the first holes 1061, as shown in FIG. 17. In some embodiments, the second conductive layer 1055 includes one or more layers of Au, Ti, Cu, Ag and Ni or an alloy thereof. In some embodiments, the second conductive layer 1055 is a gold (Au) layer formed on a Ti layer. In other embodiments, the second conductive layer 1055 consists of one, two, three, four or five layers made of different materials from each other. For example, the second conductive layer 1055 has a layered structure of A/B/C/D/E, A/B/C/D, A/B/C, A/B or A (A/B means B on A), where each of A, B, C, D and E represents a metal or metallic material. In other embodiments, the second conductive layer 1055 consists of two, three, four or five layers, in which adjacent layers are made of different materials from each other. For example, the second conductive layer 1055 has a layered structure of A/B/A/B, A/B/B/A, A/B or A/A. In some embodiments, the film structure of the second conductive layer 1055 is the same as that of the first conductive layer 1050, and in other embodiments, the film structure of the second conductive layer 1055 is different from that of the first conductive layer 1050. In some embodiments, at least one metal layer of the first conductive layer 1050 is the same as that of the second conductive layer 1055.

In some embodiments, the second conductive layer 1055 is formed by CVD, PVD including sputtering, ALD, plating or any other suitable film deposition method. In certain embodiments, a sputtering method is used. In some embodiments, each of the metal or metallic layers of the second conductive layer 1055 has a thickness in a range from about 2 nm to about 100 nm.

In some embodiments, the second conductive layer 1055 is conformally formed inside the first holes 1061 such that the inner sidewall of the first holes 1061, on which the first conductive layer 1050 is at least partially formed and exposed, are fully covered by the second conductive layer 1055. In other embodiments, the inner sidewall of the exposed first holes 1061 is only partially covered by the second conductive layer 1055 and a part of the first conductive layer 1050 is exposed in the first holes 1061. Since the second conductive layer 1055 is formed after the dicing operation, the second conductive layer 1055 is formed on the side faces of the chip. In some embodiments, the second conductive layer 1055 functions as a seed layer for electroplating in the subsequent process.

Next, as shown in FIG. 18, a fourth mask layer 1140 having one or more openings 1107 over the second holes 1062, in which the third conductive layer 1200 is filled, is formed over the back side of the circuit substrate 1020 in the recess. In some embodiments, the fourth mask layer 1140 is a photo resist layer. Then, a fifth conductive layer 1220 is formed at the bottom of the openings 1107 on the second conductive layer 1055, as shown in FIG. 18. In some embodiments, the fifth conductive layer 1220 includes one or more layers of Au, Ti, Cu, Ag and Ni or an alloy thereof. In some embodiments, the fifth conductive layer 1220 is a copper (Cu) or a Cu alloy layer. In other embodiments, the fifth conductive layer 1220 consists of one, two, three, four or five layers made of different materials from each other. For example, in some embodiments, the fifth conductive layer 1220 has a layered structure of A/B/C/D/E, A/B/C/D, A/B/C, A/B or A (A/B means B on A), where each of A, B, C, D and E represents a metal or metallic material. In other embodiments, the fifth conductive layer 1220 consists of two, three, four or five layers, in which adjacent layers are made of different materials from each other. In some embodiments, the fifth conductive layer 1220 is formed by electroplating using the second conductive layer 1055 as a seed layer. After the fifth conductive layer 1220 is formed, the fourth mask layer 1140 is removed.

Figure 19:
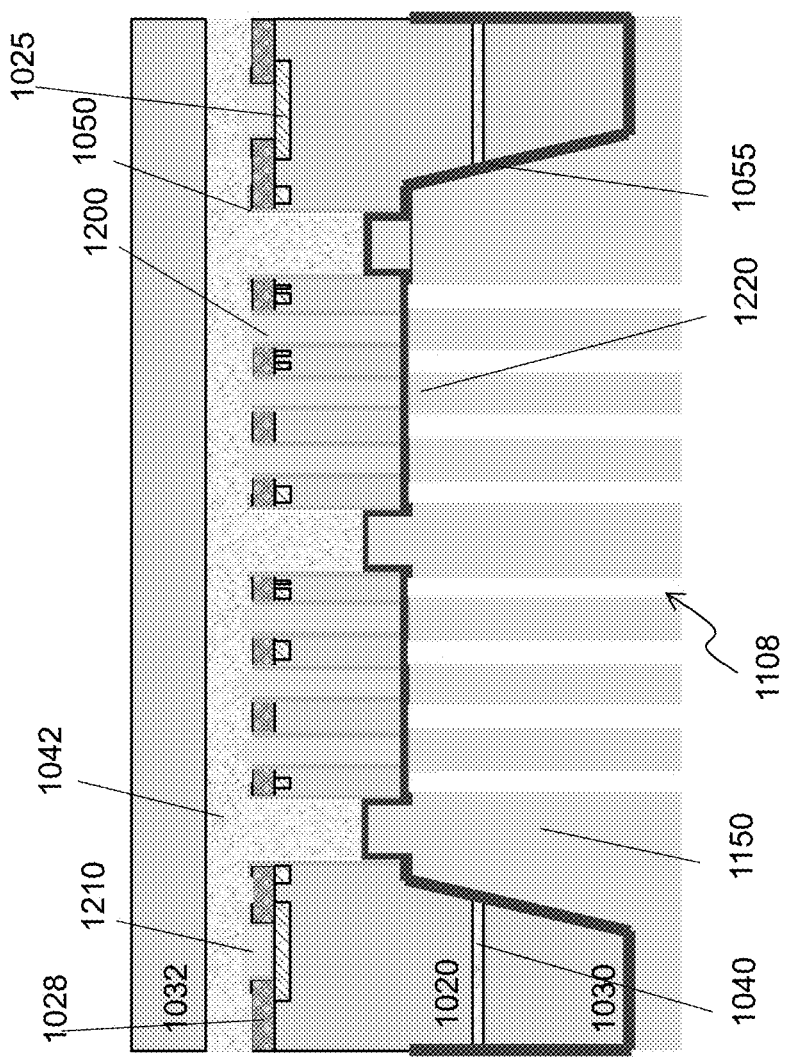
Figure 20:
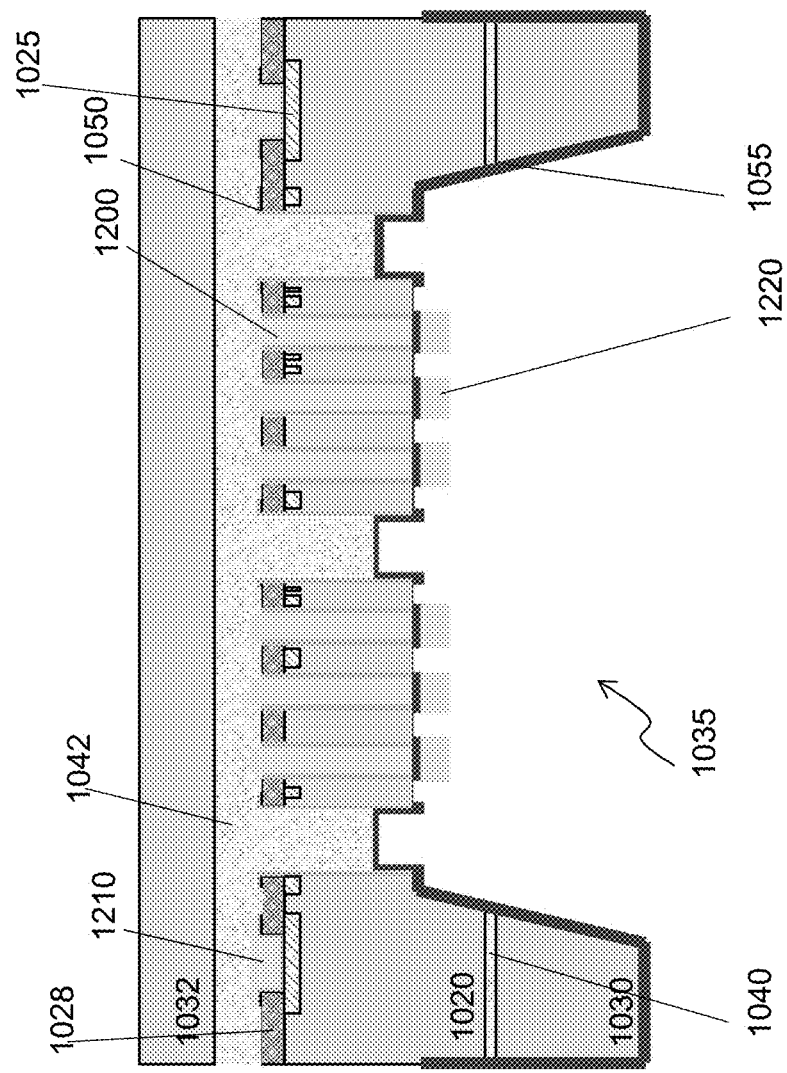

Next, as shown in FIG. 19, a fifth mask layer 1150 having one or more openings 1108 is formed over the back side of the circuit substrate 1020. In some embodiments, the fifth mask layer 1150 is a photo resist layer. As shown in FIG. 19, the fifth mask layer 1150 covers the fifth conductive layers 1220 and the second holes, and unnecessary portions of the second and/or fifth conductive layers are removed by one or more dry and/or wet etching operations. By this etching operation, the conductive layers are appropriately isolated from each other. After the etching operation, the fifth mask layer 1150 is removed as shown in FIG. 20.

Figure 21:
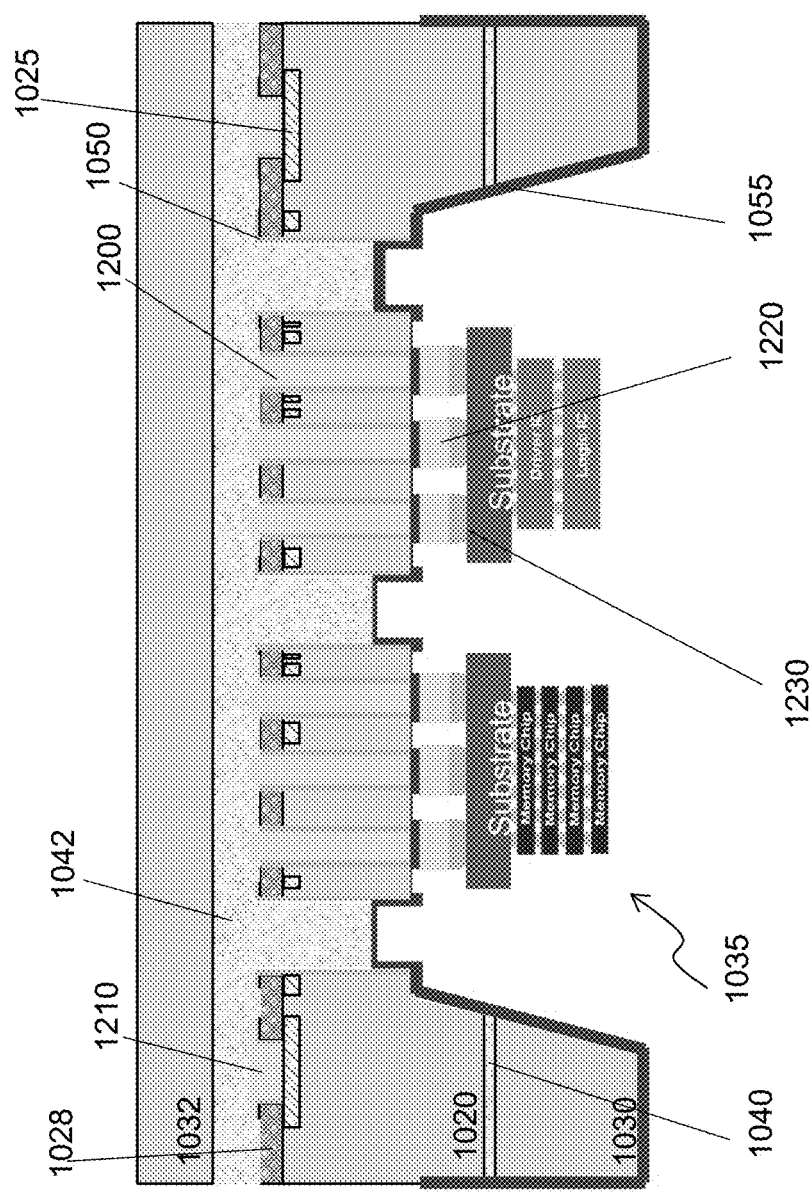

Further, in some embodiments, one or more semiconductor integrated circuits (IC) are attached to the TSV electrodes 1200 via bonding electrode 1230 in the recess 1035, as shown in FIG. 21. In some embodiments, the semiconductor IC includes a substrate, on which one or more memory chips are disposed laterally or stacked vertically together with control circuitry, and in other embodiments, the semiconductor IC includes a substrate, on which various circuits, such as a driver circuit, a logic circuit or any other electronic circuits are disposed laterally or stacked vertically. In some embodiments, the semiconductor ICs are fully disposed within the recess 1035. The ICs are packaged in some embodiments, and in other embodiments, the ICs are bare chips without resin moldings.

Figure 22:
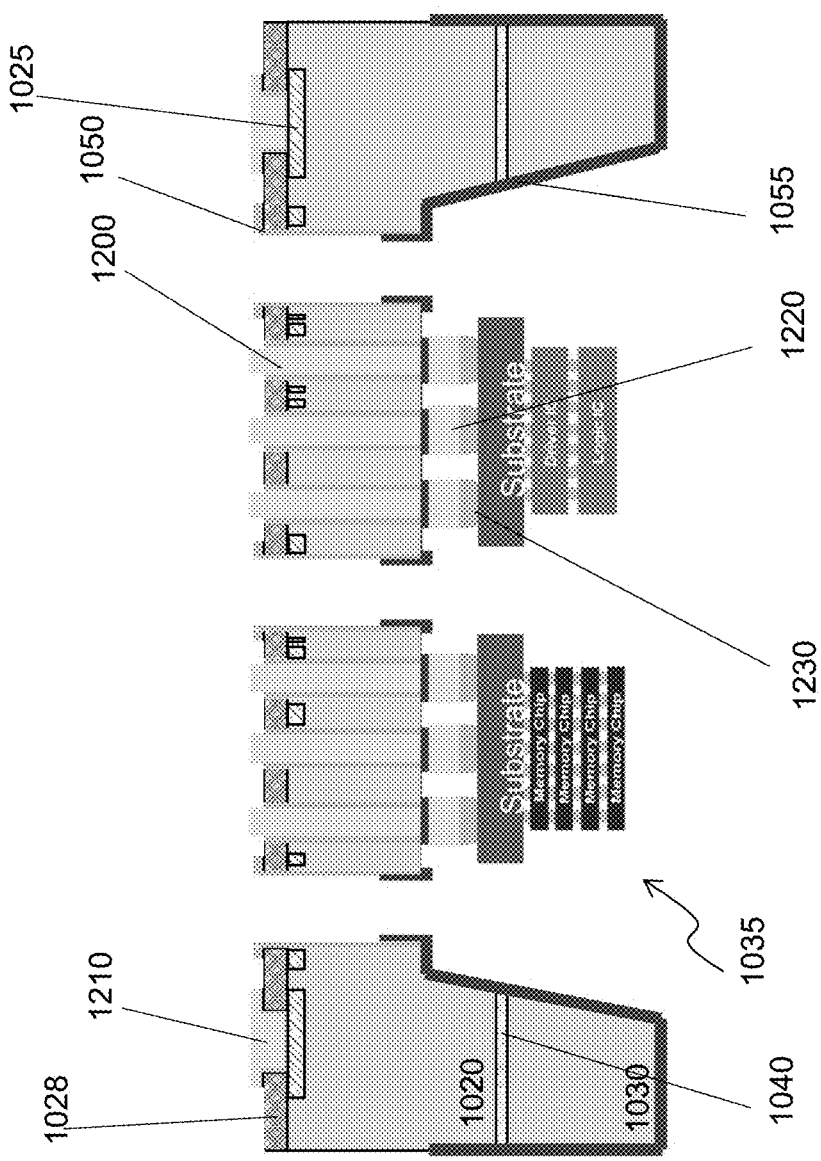
Figure 23:
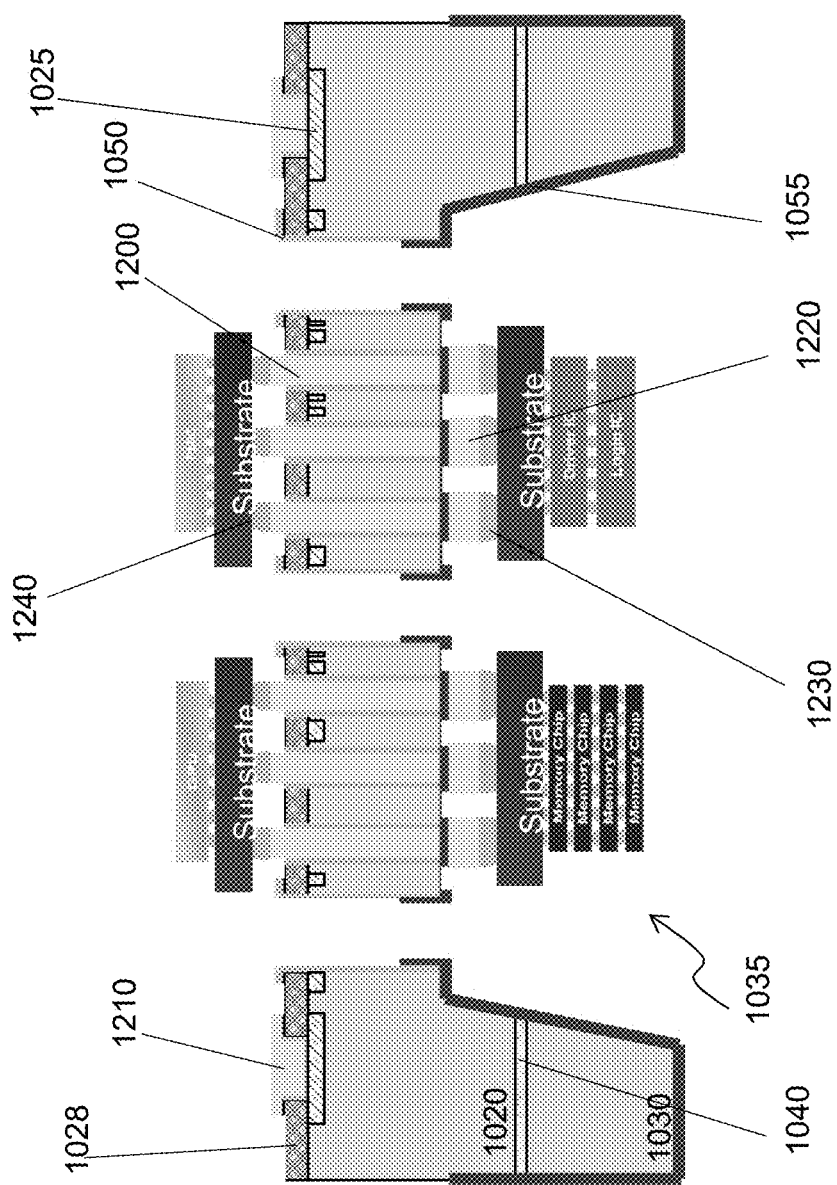

Then, as shown in FIG. 22, the dummy substrate 1032 and the first bonding layer 1042 are removed. Further, in some embodiments, one or more semiconductor integrated circuits (IC) are attached to the TSV electrodes 1200 via bonding electrode 1240 at the front side of the circuit substrate 1020, as shown in FIG. 23. In some embodiments, the semiconductor IC includes a substrate, on which one or more processors (e.g., central processing unit, micro processing unit, graphic processing unit (GPU), and etc.) are disposed laterally or stacked vertically, and in other embodiments, the semiconductor IC includes a substrate, on which various circuits, such as a driver circuit (e.g., power management IC (PMIC)), a logic circuit or any other electronic circuits are disposed laterally or stacked vertically. The ICs are packaged in some embodiments, and in other embodiments, the ICs are bare chips without resin moldings.

Further, in some embodiments, as shown in FIG. 24A, one or more heat sink 1300 is disposed at the front side of the circuit substrate 1020. In some embodiments, the heat sink 1030 is in contact with the semiconductor IC directly or via one or more layers of heat transfer materials and/or bonding materials. In some embodiments, the heat sink 1300 is connected to the third conductive layer (UBM layers) 1210 via a bump electrode 1250, as shown in FIG. 24A.

FIG. 24B is a plan view (top view) without showing some layers/elements of the MEMS device shown in FIG. 24A. As shown in FIG. 24B, heat dissipation holes 1061 (first holes), inside which is covered by the first and second conductive layers, surround the semiconductor ICs (e.g., IC-1 and IC-2, either or both of the ICs over the front side or the back side of the circuit substrate 20).

In some embodiments, the structures and configurations of the first conductive layer 1050, the second conductive layer 1055 at the area A2 of FIG. 24A is the same as those of the first conductive layer 50 and the second conductive layer 55 shown in FIGS. 2B, 2C and 2D, and the detailed description as set forth above are incorporated herein.

In other embodiments, the operations explained with respect to FIGS. 1K-1P are also applied to the embodiments of FIGS. 5-24B.

In the embodiments of the present disclosure, in a MEMS device, since the first and second conductive layers are coupled to each other and partially or fully cover the inner sidewall of the through holes, it is possible to improve heat dissipation. In some embodiments, since the inner wall of the heat dissipation holes are continuously and fully covered by one or more conductive layers, the heat dissipation efficiency of the MEMS device can be improved.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

In accordance with one aspect of the present disclosure, a micro electro mechanical system (MEMS) includes a circuit substrate comprising electronic circuitry, a support substrate having a recess, a bonding layer disposed between the circuit substrate and the support substrate, through holes passing through the circuit substrate to the recess, a first conductive layer disposed on a front side of the circuit substrate, and a second conductive layer disposed on an inner wall of the recess. The first conductive layer extends into the through holes and the second conductive layer extends into the through holes and coupled to the first conductive layer. In one or more of the foregoing and following embodiments, the bonding layer includes silicon oxide. In one or more of the foregoing and following embodiments, in the recess, no bonding layer is disposed and a bottom of the circuit substrate is in contact with the second conductive layer. In one or more of the foregoing and following embodiments, the second conductive layer overlaps the first conductive layer in the through holes. In one or more of the foregoing and following embodiments, the second conductive layer continuously cover a bottom of the support substrate and at least partially covers an outer side face of the MEMS. In one or more of the foregoing and following embodiments, the second conductive layer fully covers a side face of the bonding layer. In one or more of the foregoing and following embodiments, each of the first conductive layer and the second conductive layer includes one or more layers of Au, Ti, Ni, Ag and Cu or an alloy thereof. In one or more of the foregoing and following embodiments, a configuration of the one or more layer of the first conductive layer is different from the one or more layer of the second conductive layer. In one or more of the foregoing and following embodiments, a configuration of the one or more layer of the first conductive layer is the same as the one or more layer of the second conductive layer.

In accordance with another aspect of the present disclosure, a MEMS includes a circuit substrate comprising electronic circuitry, a passivation layer disposed over the circuit substrate, a support substrate having a recess, through holes passing through the circuit substrate to the recess, and a conductive layer covering the passivation layer, inner sidewalls of the through holes, an inner wall of the recess and at least a part of a side face of the MEMS. In one or more of the foregoing and following embodiments, a part of the side face of the MEMS is not covered by the conductive layer. In one or more of the foregoing and following embodiments, the conductive layer includes one or more layer of Au, Ti, Ni, Ag and Cu. In one or more of the foregoing and following embodiments, an entirety of the conductive layer is made of one material. In one or more of the foregoing and following embodiments, a thickness of the conductive layer on the inner sidewalls of the through holes is not uniform. In one or more of the foregoing and following embodiments, the MEMS further includes an insulating layer disposed between the circuit substrate and the support substrate. In one or more of the foregoing and following embodiments, the circuit substrate and the support substrate are part of a single substrate.

In accordance with another aspect of the present disclosure, in a method of manufacturing a MEMS, electronic circuitry is formed over a front side of a first substrate, holes penetrating into the first substrate are formed, a first conductive layer is formed over the front side of the first substrate and on at least part of inner sidewalls of the holes, the holes are filled with a filling material, a back side of the first substrate is thinned, a second substrate is bonded to the back side of the first substrate with a bonding layer interposed therebetween, a recess is formed in the second substrate so that a bottom of the first substrate is exposed, through holes are formed by removing the filling material, and a second conductive layer is formed on an inner wall of the recess and on at least a part of inner sidewalls of the through holes not covered by the first conductive layer. In one or more of the foregoing and following embodiments, before the second conductive layer is formed, a dicing process is performed to cut out the MEMS. In one or more of the foregoing and following embodiments, the second conductive layer is also formed on a cut side face of the MEMS. In one or more of the foregoing and following embodiments, at least one of the first and second conductive layers is made by a sputtering process.

In accordance with another aspect of the present disclosure, a semiconductor device includes a circuit substrate comprising electronic circuitry, a support substrate having a recess, a bonding layer disposed between the circuit substrate and the support substrate, through holes passing through the circuit substrate to the recess, through vias made of a conductive material and passing through the circuit substrate, a first conductive layer disposed on a front side of the circuit substrate, a second conductive layer disposed on an inner wall of the recess, a first semiconductor integrated circuit (IC) disposed on a front side of the circuit substrate and coupled to at least one of the through vias, and a second semiconductor IC disposed on a back side of the circuit substrate within the recess and coupled to at least one of the through vias. In one or more of the foregoing and following embodiments, the first conductive layer extends into the through holes and the second conductive layer extends into the through holes and is coupled to the first conductive layer. In one or more of the foregoing and following embodiments, the bonding layer includes silicon oxide, and in the recess, no bonding layer is disposed and a bottom of the circuit substrate is in contact with the second conductive layer. In one or more of the foregoing and following embodiments, the second conductive layer overlaps the first conductive layer in the through holes. In one or more of the foregoing and following embodiments, the second conductive layer continuously covers a bottom of the support substrate and at least partially covers an outer side face of the semiconductor device. In one or more of the foregoing and following embodiments, the second conductive layer fully covers a side face of the bonding layer. In one or more of the foregoing and following embodiments, each of the first conductive layer and the second conductive layer includes one or more layers of Au, Ti, Ni, Ag and Cu or an alloy thereof. In one or more of the foregoing and following embodiments, a configuration of the one or more layer of the first conductive layer is different from the one or more layer of the second conductive layer. In one or more of the foregoing and following embodiments, a configuration of the one or more layer of the first conductive layer is the same as the one or more layer of the second conductive layer.

In accordance with another aspect of the present disclosure, a semiconductor device includes a circuit substrate comprising electronic circuitry, a passivation layer disposed over the circuit substrate, a support substrate having a recess, through holes passing through the circuit substrate to the recess, through vias made of a conductive material and passing through the circuit substrate, a first semiconductor integrated circuit (IC) disposed on a front side of the circuit substrate and coupled to at least one of the through vias, a second semiconductor IC disposed on a back side of the circuit substrate within the recess and coupled to at least one of the through vias, and a conductive layer covering the passivation layer, inner sidewalls of the through holes, an inner wall of the recess and at least a part of a side face of the semiconductor device. In one or more of the foregoing and following embodiments, a part of the side face of the semiconductor device is not covered by the conductive layer. In one or more of the foregoing and following embodiments, the conductive layer includes one or more layer of Au, Ti, Ni, Ag and Cu. In one or more of the foregoing and following embodiments, an entirety of the conductive layer is made of one material. In one or more of the foregoing and following embodiments, a thickness of the conductive layer on the inner sidewalls of the through holes is not uniform. In one or more of the foregoing and following embodiments, the semiconductor device further includes an insulating layer disposed between the circuit substrate and the support substrate. In one or more of the foregoing and following embodiments, in plan view, the through holes surround the first semiconductor IC.

In accordance with another aspect of the present disclosure, a semiconductor device includes a circuit substrate comprising electronic circuitry, a passivation layer disposed over the circuit substrate, a support substrate having a recess, through holes passing through the circuit substrate to the recess, through vias made of a conductive material and passing through the circuit substrate, a first semiconductor integrated circuit (IC) disposed on a front side of the circuit substrate and coupled to at least one of the through vias, a heat radiator coupled to the first semiconductor IC, and a conductive layer covering the passivation layer, inner sidewalls of the through holes, an inner wall of the recess and at least a part of a side face of the semiconductor device. In one or more of the foregoing and following embodiments, the heat radiator is coupled to the circuit substrate via one or more conductive layers without interposing any semiconductor IC. In one or more of the foregoing and following embodiments, the conductive material of the through vias includes one or more layer of Cu or a Cu alloy. In one or more of the foregoing and following embodiments, the through vias protrude from an upper surface of the passivation layer.

In accordance with another aspect of the present disclosure, in a method of manufacturing a semiconductor device, electronic circuitry is formed on a front side of a first substrate, first holes and second holes penetrating into the first substrate are formed, a first conductive layer is formed over the front side of the first substrate and on at least part of inner sidewalls of the first and second holes, through vias are formed by filling the second holes with a conductive material while covering the first holes, a second substrate is bonded to the front side of the first substrate with a first bonding layer interposed therebetween, a third substrate is bonded to the back side of the first substrate with a second bonding layer interposed therebetween, a recess is formed in the third substrate so that a part of the first substrate is exposed, the first bonding material is recessed in the first holes, and a second conductive layer is formed on an inner wall of the recess and on at least a part of inner sidewalls of the first holes. In one or more of the foregoing and following embodiments, bottom electrodes are formed on bottoms of the through vias within the recess, and one or more semiconductor integrated circuits (ICs) are attached to the bottom electrodes. In one or more of the foregoing and following embodiments, upper electrodes are formed on tops of the through vias at the front side of the first substrate, one or more first semiconductor integrated circuits (ICs) are attached to the upper electrodes. In one or more of the foregoing and following embodiments, a heat radiator is attached to the one or more first semiconductor ICs and to the first substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A micro electro mechanical system (MEMS), comprising:
    a circuit substrate comprising electronic circuitry;
    a support substrate having a recess;
    a bonding layer disposed between the circuit substrate and the support substrate;
    through holes passing through the circuit substrate to the recess;
    a first conductive layer disposed on a front side of the circuit substrate and in direct contact with an inner wall of the through holes; and
    a second conductive layer disposed on and in direct contact with an inner wall of the recess,
    wherein the first conductive layer extends into the through holes and the second conductive layer extends into the through holes and is coupled to the first conductive layer.

2. The MEMS of claim 1, wherein the bonding layer includes silicon oxide.

3. The MEMS of claim 2, wherein in the recess, no bonding layer is disposed and a bottom of the circuit substrate is in contact with the second conductive layer.

4. The MEMS of claim 1, wherein the second conductive layer overlaps the first conductive layer in the through holes.

5. The MEMS of claim 1, wherein the second conductive layer continuously covers a bottom of the support substrate and at least partially covers an outer side face of the MEMS.

6. The MEMS of claim 5, wherein the second conductive layer fully covers a side face of the bonding layer.

7. The MEMS of claim 1, wherein each of the first conductive layer and the second conductive layer includes one or more layers of Au, Ti, Ni, Ag and Cu or an alloy thereof.

8. The MEMS of claim 7, wherein a configuration of the one or more layer of the first conductive layer is different from the one or more layer of the second conductive layer.

9. The MEMS of claim 7, wherein a configuration of the one or more layer of the first conductive layer is a same as the one or more layer of the second conductive layer.

10. A micro electro mechanical system (MEMS), comprising:
    a circuit substrate comprising electronic circuitry;
    a passivation layer disposed over the circuit substrate;
    a support substrate having a recess;
    through holes passing through the circuit substrate to the recess; and
    a conductive layer covering the passivation layer, inner sidewalls of the through holes, an inner wall of the recess and only a lower part of a side face of the MEMS.

11. The MEMS of claim 10, wherein a part of the side face of the MEMS is not covered by the conductive layer.

12. The MEMS of claim 10, wherein the conductive layer includes one or more layer of Au, Ti, Ni, Ag and Cu.

13. The MEMS of claim 12, wherein an entirety of the conductive layer is made of one material.

14. The MEMS of claim 10, wherein a thickness of the conductive layer on the inner sidewalls of the through holes is not uniform.

15. The MEMS of claim 10, further comprising an insulating layer disposed between the circuit substrate and the support substrate.

16. The MEMS of claim 10, wherein the circuit substrate and the support substrate are part of a single substrate.

17. A micro electro mechanical system (MEMS), comprising:
    a circuit substrate comprising electronic circuitry;
    a support substrate having a recess;
    a bonding layer disposed between the circuit substrate and the support substrate;
    first through holes passing through the circuit substrate to the recess;
    second through holes passing through the circuit substrate to the recess and filled with a conductive material;
    a first conductive layer disposed on a front side of the circuit substrate; and
    a second conductive layer disposed on an inner wall of the recess, wherein:
    an end portion of the first conductive layer extends into the through holes and has a tapered shape and an end portion of the second conductive layer extends into the through holes and has a tapered shape, and
    the end portion of the first conductive layer having the tapered shape overlaps the end portion of the second conductive layer having the tapered shape.

18. The MEMS of claim 17, further comprising one or more first circuits coupled to the second through holes.

19. The MEMS of claim 18, wherein the one or more first circuits are disposed in the recess.

20. The MEMS of claim 19, further comprising one or more second circuits coupled to the second through holes and disposed over the circuit substrate.

\* \* \* \* \*